(12) United States Patent
Lee et al.

(10) Patent No.: US 11,047,823 B2
(45) Date of Patent: *Jun. 29, 2021

(54) ELECTRONIC PANEL AND ELECTRONIC APPARATUS COMPRISING THE SAME

(71) Applicant: Samsung Display Co., Ltd., Yongin-si (KR)

(72) Inventors: Changho Lee, Busan (KR); Gyeongnam Bang, Seoul (KR); Hyeyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/695,984

(22) Filed: Nov. 26, 2019

(65) Prior Publication Data

US 2020/0173949 A1   Jun. 4, 2020

(30) Foreign Application Priority Data

Nov. 30, 2018 (KR) .................. 10-2018-0152483

(51) Int. Cl.
| | |
|---|---|
| *G06F 3/044* | (2006.01) |
| *G06F 3/041* | (2006.01) |
| *G01N 27/27* | (2006.01) |
| *H01L 27/32* | (2006.01) |
| *G01N 27/24* | (2006.01) |

(52) U.S. Cl.
CPC ........... *G01N 27/24* (2013.01); *G06F 3/0412* (2013.01); *G06F 3/0446* (2019.05); *H01L 27/323* (2013.01); *G06F 2203/04112* (2013.01); *H01L 27/3276* (2013.01)

(58) Field of Classification Search
CPC ................. G06F 3/0446; G06F 3/0412; G06F 2203/04112; G06F 3/044; G06F 3/041
See application file for complete search history.

(56) References Cited

U.S. PATENT DOCUMENTS

| | | | |
|---|---|---|---|
| 9,653,368 B2 | 5/2017 | Kwak et al. | |
| 2011/0063237 A1* | 3/2011 | Hung | G06F 3/0445 |
| | | | 345/173 |
| 2016/0307971 A1* | 10/2016 | Jeon | H01L 51/5246 |

(Continued)

FOREIGN PATENT DOCUMENTS

| | | |
|---|---|---|
| KR | 10-2017-0107616 A | 9/2017 |
| KR | 10-2017-0136687 A | 12/2017 |
| KR | 10-2018-0049296 A | 5/2018 |

*Primary Examiner* — Md Saiful A Siddiqui

(74) *Attorney, Agent, or Firm* — Lewis Roca Rothgerber Christie LLP

(57) ABSTRACT

An electronic panel includes a base substrate having a first area, a second area adjacent to the first area, and a third area adjacent to the second area, a plurality of sensing electrodes in the second area, a plurality of sensing lines in the third area and electrically connected to the plurality of sensing electrodes, a crack sensing pattern in the first area and spaced apart from the plurality of sensing electrodes, a crack sensing line in the third area and spaced apart from the plurality of sensing lines, and a connection line connecting the crack sensing pattern to the crack sensing line via the second area and including a floating portion, wherein the floating portion is at the same layer as the crack sensing pattern and is spaced apart from the plurality of sensing electrodes.

20 Claims, 21 Drawing Sheets

(56) References Cited

U.S. PATENT DOCUMENTS

| | | |
|---|---|---|
| 2017/0270842 A1 | 9/2017 | Nam et al. |
| 2017/0353181 A1 | 12/2017 | Kim et al. |
| 2018/0033355 A1* | 2/2018 | Lee ..................... H01L 27/3223 |
| 2018/0053466 A1 | 2/2018 | Zhang et al. |
| 2018/0053792 A1* | 2/2018 | Shin ..................... H01L 27/1244 |
| 2018/0224984 A1* | 8/2018 | Kim ...................... G06F 3/0412 |

* cited by examiner

ELECTRONIC PANEL AND ELECTRONIC APPARATUS COMPRISING THE SAME

CROSS-REFERENCE TO RELATED APPLICATION

This application claims priority to and the benefit of Korean Patent Application No. 10-2018-0152483, filed on Nov. 30, 2018, the entire contents of which are hereby incorporated by reference.

BACKGROUND

The present disclosure herein relates to an electronic apparatus, and more particularly, to an electronic apparatus having a through-hole defined therein and configured to sense an external input.

Electronic apparatuses are activated in response to electrical signals. Electronic apparatuses are composed of various types of electronic components such as electronic panels and electronic modules. Electronic panels may include display units for displaying images or sensing units for sensing external inputs. Electronic components may be electrically connected to each other by signal lines that are arranged in various ways.

Display units include light-emitting elements for generating images. Sensing units may include sensing electrodes for sensing external inputs. Sensing electrodes are disposed in active areas. Sensing units are designed to provide uniform sensitivity for the entirety of active areas.

SUMMARY

The present disclosure provides an electronic apparatus with improved reliability.

An embodiment of the inventive concept provides an electronic panel including: a base substrate having a first area, a second area adjacent to the first area, and a third area adjacent to the second area; a plurality of sensing electrodes in the second area; a plurality of sensing lines in the third area and electrically connected to the plurality of sensing electrodes; a crack sensing pattern in the first area and spaced apart from the plurality of sensing electrodes; a crack sensing line in the third area and spaced apart from the plurality of sensing lines; and a connection line connecting the crack sensing pattern to the crack sensing line via the second area and including a floating portion, wherein the floating portion is at the same layer as the crack sensing pattern and spaced apart from the plurality of sensing electrodes.

In an embodiment, each of the plurality of sensing electrodes may include: a first sensing electrode including a first sensing pattern and a first connection pattern connected to the first sensing pattern; and a second sensing electrode including a second sensing pattern spaced apart from the first sensing pattern, and a second connection pattern at a different layer from the first connection pattern and connected to the second sensing pattern, and the floating portion may be at the same layer as the first connection pattern or the second connection pattern.

In an embodiment, at least one of the first sensing pattern or the second sensing pattern may include: a main portion having a plurality of opening portions; and a plurality of floating patterns in the plurality of opening portions and spaced apart from the main portion, and the floating portion may be at at least one of the plurality of opening portions.

In an embodiment, the floating portion may be at the same layer as the main portion.

In an embodiment, the floating portion may include: a first floating portion connected to a first end of the crack sensing pattern; and a second floating portion spaced apart from the floating portion and connected to a second end of the crack sensing pattern.

In an embodiment, at least one of the first floating portion or the second floating portion may have an integral shape.

In an embodiment, at least one of the first floating portion or the second floating portion may include a plurality of patterns spaced apart from each other and a plurality of contact patterns connecting the plurality of patterns, and the plurality of contact patterns may be at a different layer from the plurality of patterns.

In an embodiment, the electronic panel may further include a connection line in the first area and connecting two of the first sensing patterns of the first sensing electrodes, the two first sensing patterns being spaced apart from each other with the first area therebetween, the connection line may be at the same layer as the crack sensing pattern, and the connection line and the crack sensing pattern may be spaced apart from each other.

In an embodiment, a first end of the connection line may be connected to the first connection pattern connected to one of the two first sensing patterns, and a second end of the connection line may be connected to the first connection pattern connected to the other of the two first sensing patterns.

In an embodiment, the connection line may further include a pattern connection portion connecting the floating portion to the crack sensing pattern, and the pattern connection portion may be at a different layer from the floating portion.

In an embodiment, the connection line may further include a line connection portion connecting the floating portion to the crack sensing line, and the line connection portion may be at a different layer from the floating portion.

In an embodiment, the electronic panel may further include a plurality of pixels in the second area and configured to define a plurality of light-emitting areas. Each of the plurality of sensing electrodes may include a plurality of mesh lines configured to define a plurality of mesh opening portions. The plurality of mesh opening portions may overlap the plurality of light-emitting areas.

In an embodiment, the electronic panel may further include a hole in the first area and configured to pass through the base substrate. The crack sensing pattern may have an open curve shape extending along an edge of the hole.

An embodiment of the inventive concept provides an electronic apparatus including: an electronic panel configured to sense an external input and display an image; and an electronic module configured to overlap the electronic panel, wherein the electronic panel includes: a base substrate including a hole area overlapping the electronic module, an active area adjacent to the hole area, and a peripheral area adjacent to the active area; a first sensing electrode including a first sensing pattern having at least one opening portion defined therein, and a first connection pattern connected to the first sensing pattern; a second sensing electrode including a second sensing pattern spaced apart from the first sensing pattern, and a second connection pattern at a different layer from the first connection pattern and connected to the second sensing pattern; and a crack sensor including a crack sensing pattern in the hole area and spaced apart from the first sensing electrode and the second sensing electrode, a crack sensing line in the peripheral area, and a floating portion connecting the crack sensing pattern to the crack sensing line via the active area, the floating portion being in the at least one opening portion.

In an embodiment, the crack sensor may further include a pattern connection portion connecting the floating portion to the crack sensing pattern, and the pattern connection portion may be at a different layer from the floating portion.

In an embodiment, the crack sensor may further include a line connection portion connecting the floating portion to the crack sensing line, and the line connection portion may be at a different layer from the floating portion.

In an embodiment, the floating portion may be at the same layer as the first sensing pattern.

In an embodiment, the floating portion may include a plurality of patterns spaced apart from each other and a plurality of contact patterns connecting the plurality of patterns, and the plurality of contact patterns may be at a different layer from the plurality of patterns.

In an embodiment, the floating portion may have an integral shape.

In an embodiment, each of the first sensing electrode and the second sensing electrode may include a plurality of mesh lines, and the floating portion may include the plurality of mesh lines.

BRIEF DESCRIPTION OF THE FIGURES

The accompanying drawings are comprised to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
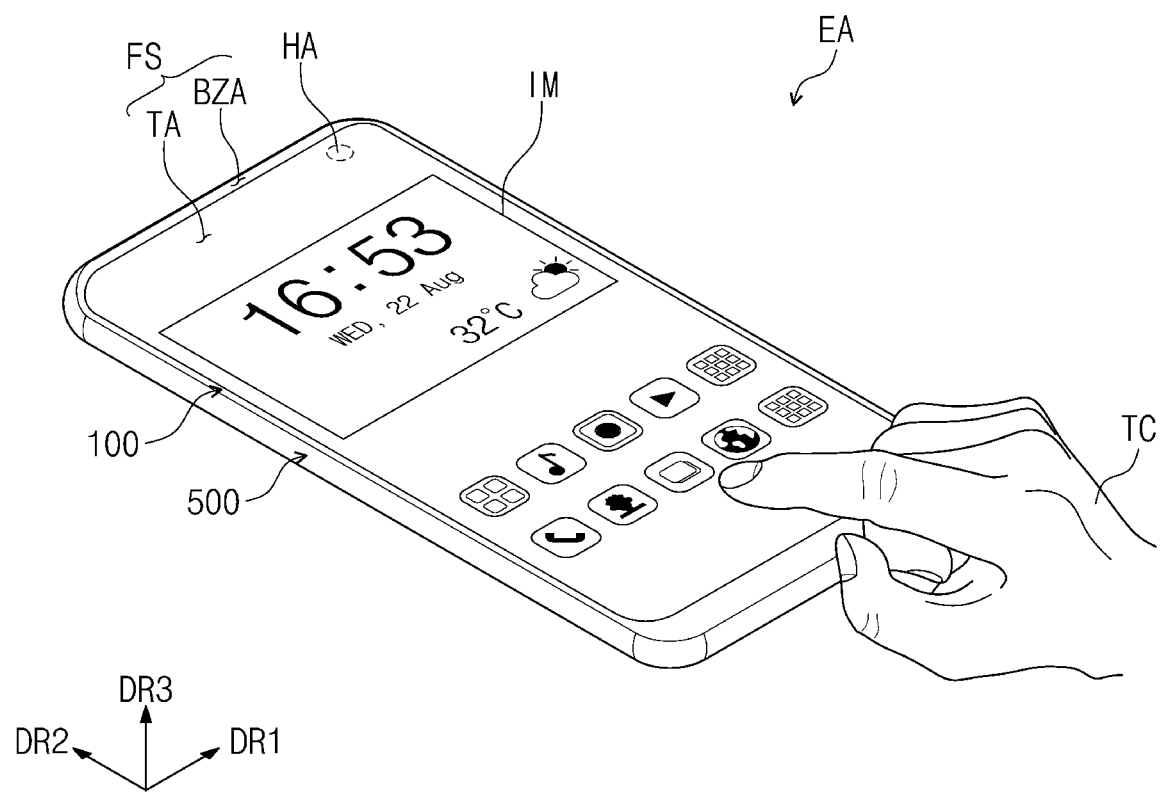
FIG. 1A is a combined perspective view of an electronic apparatus in accordance with an embodiment of the inventive concept.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic apparatus and/or any other relevant devices or components according to embodiments of the present invention described herein may be implemented utilizing any suitable hardware, firmware (e.g., an application-specific integrated circuit), software, or a combination of software, firmware, and hardware. The electronic apparatus may be a tablet, a personal computer (PC), a laptop PC, a desktop PC, a smart television, or other suitable device and may include a hole area HA. The hole area HA may have a relatively higher transmittance than an active area of a display of the electronic apparatus and may include one or more crack sensing patterns. The various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
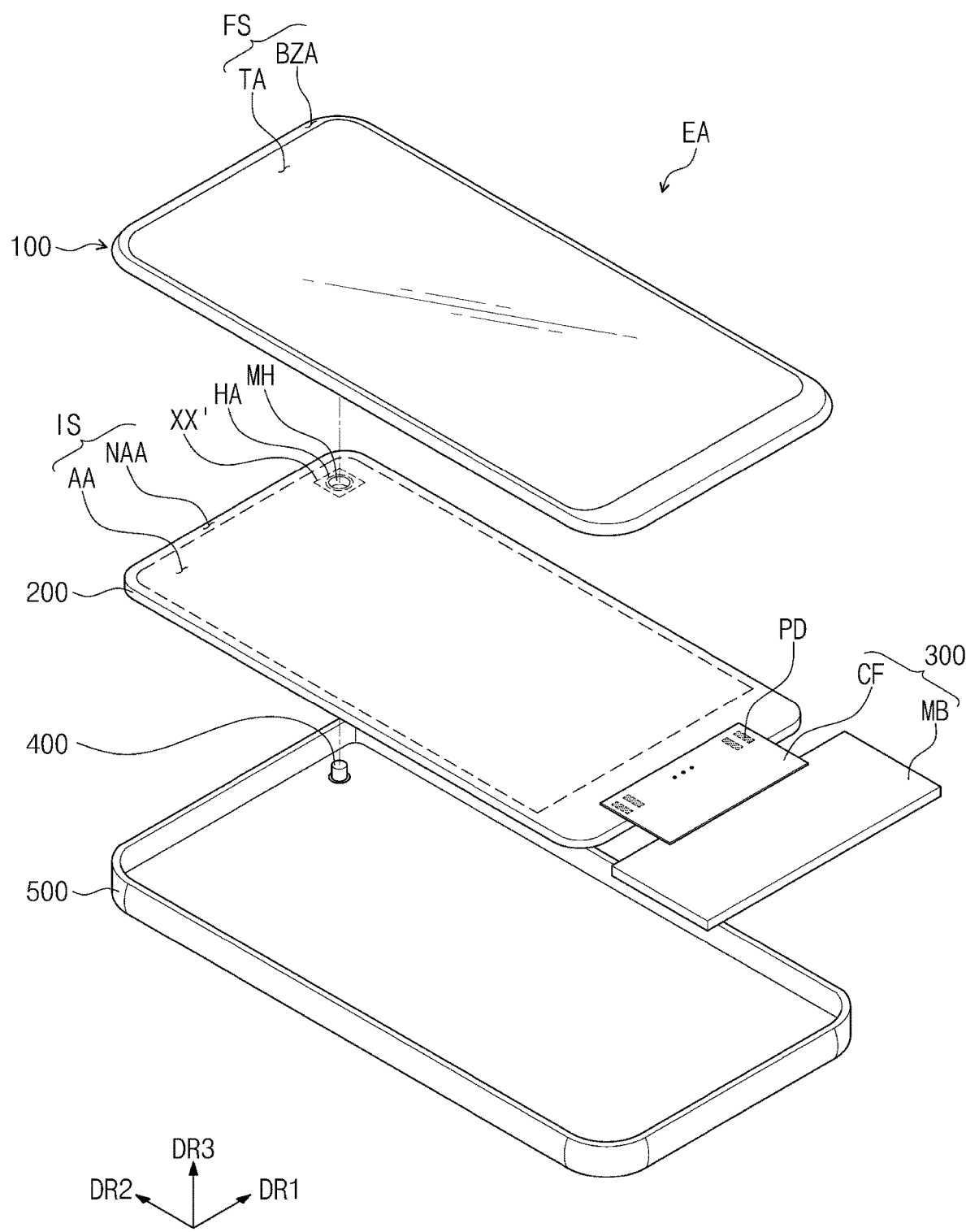
FIG. 1B is an exploded perspective view of the electronic apparatus illustrated in FIG. 1A.
Figure 2:
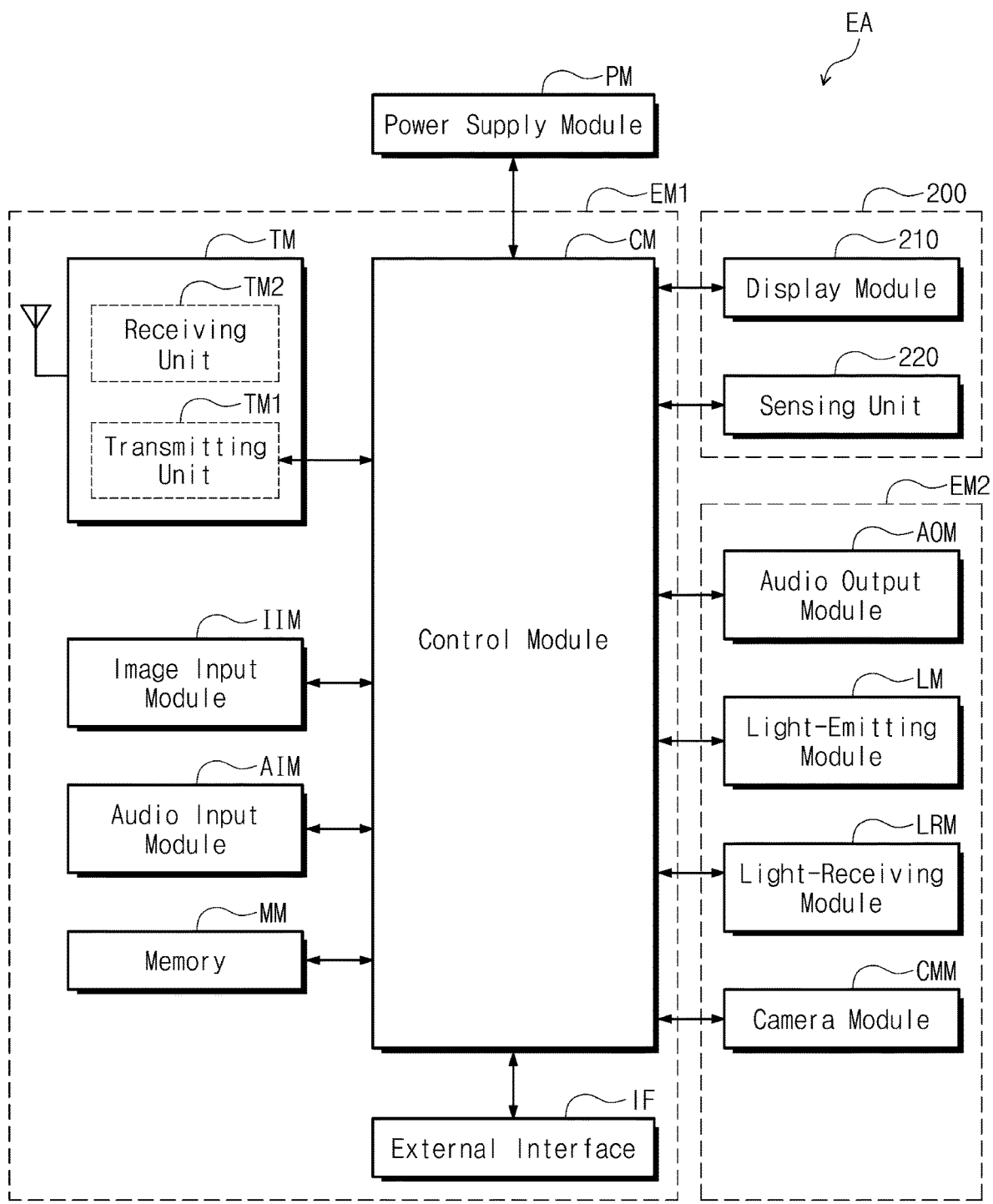
FIG. 2 is a block diagram of the electronic apparatus illustrated in FIG. 1A.

FIG. 1A is a combined perspective view of an electronic apparatus in accordance with an embodiment of the inventive concept. FIG. 1B is an exploded perspective view of the electronic apparatus illustrated in FIG. 1A. FIG. 2 is a block diagram of the electronic apparatus illustrated in FIG. 1A. Hereinafter, an embodiment of the inventive concept will be described with reference to FIGS. 1A-2.

An electronic apparatus EA may be activated in response to an electrical signal. The electronic apparatus EA may include various embodiments. For example, the electronic apparatus EA may be a tablet, a personal computer (PC), a laptop PC, a desktop PC, a smart television, and the like. In the present embodiment, the electronic apparatus EA is illustratively depicted as a smartphone.

As illustrated in FIG. 1A, the electronic apparatus EA may display an image IM on a front surface FS thereof. The front surface FS may be defined to be in parallel to a plane (e.g., a surface) that is defined by a first direction DR1 and a second direction DR2. The front surface FS includes a transmitting area TA and a bezel area BZA adjacent to the transmitting area TA.

The electronic apparatus EA displays the image IM in the transmitting area TA. The image IM may include at least a static image or a dynamic image. FIG. 1A illustrates a clock and a plurality of icons as an example of the image IM.

The transmitting area TA may have a quadrangular shape (e.g., a quadrilateral shape) that is parallel to each of the first direction DR1 and the second direction DR2. It should be understood that the depicted transmitting area TA is illustrative only and any other suitable transmitting area may be used. The transmitting area TA may also have various suitable shapes, and is not limited to any one embodiment as would be understood by those skilled in the art.

The bezel area BZA is adjacent to the transmitting area TA. The bezel area BZA may encompass (e.g., surround or partially surround) the transmitting area TA. The bezel area BZA is for illustrative purposes only and any other suitable bezel areas may be used. The bezel area BZA may also be disposed adjacent to only one side of the transmitting area TA or omitted. The electronic apparatus EA, in accordance with an embodiment of the inventive concept, may include various embodiments, and is not limited to any one embodiment as would be understood by those skilled in the art.

A normal direction of the front surface FS may correspond to a thickness direction (hereinafter referred to as a third direction DR3) of the electronic apparatus EA. In the present embodiment, a front surface (or an upper surface) and a rear surface (or a lower surface) of each member are defined with respect to a direction in which the image IM is displayed. The front surface and the rear surface oppose each other in the third direction DR3 (e.g., the front surface and the rear surface face away from or are opposite to each other).

Directions indicated by the first to third directions DR1, DR2, and DR3 are relative concepts and may be changed to other directions. Hereinafter, the first to third directions DR1, DR2, and DR3 indicate the directions, respectively, and are denoted by the same reference numerals.

The electronic apparatus EA in accordance with an embodiment of the inventive concept may sense a user's external input TC that is applied to the electronic apparatus EA from the outside. The user's external input TC may include various types of external inputs such as a portion of the user's body, light, heat, and/or pressure. Further, the electronic apparatus EA may sense an input through an approach towards the electronic apparatus EA, as well as an input through contact therewith.

In the present embodiment, the user's external input TC is illustrated as the user's hand that is applied to the front surface FS. The user's external input TC is for illustrative purposes only. The user's external input TC may also be provided in various forms as described above and as understood by those skilled in the art. Further, the electronic apparatus EA may sense the user's external input TC applied to a lateral surface or a rear surface of the electronic apparatus EA according to a structure of the electronic apparatus EA, but is not limited to any one embodiment.

As illustrated in FIG. 1B, the electronic apparatus EA may include a window 100, an electronic panel 200, a circuit board 300, an electronic module 400, and an external case 500. The window 100 and the external case 500 are combined to define an exterior of the electronic apparatus EA. It should be understood that the depicted electronic apparatus EA is illustrative only and any other suitable electronic apparatus may be used. The electronic apparatus EA may also include other components in addition to those illustrated in FIG. 1B, and is not limited to any one embodiment.

The window 100 is disposed on the electronic panel 200 to cover a front surface IS of the electronic panel 200. The window 100 may include an optically transparent insulating material. For example, the window 100 may be constructed using glass or plastic. The window 100 may have a multi-layer or a single-layer structure. For example, the window 100 may have a stacked structure of a plurality of plastic films that are bonded with an adhesive or may have a stacked structure of a glass substrate and a plastic film that are bonded with an adhesive.

The window 100 includes a front surface FS that is exposed to the outside. The front surface FS of the electronic apparatus EA may be substantially defined by the front surface FS of the window 100.

The transmitting area TA may be optically transparent. The transmitting area TA may have a shape that corresponds to an active area AA. For example, the transmitting area TA overlaps a front surface or at least a portion of the active area AA. The image IM, displayed in the active area AA of the electronic panel 200, may be viewed from the outside through the transmitting area TA.

The bezel area BZA may have a low light transmittance compared to the transmitting area TA. The bezel area BZA defines a shape of the transmitting area TA. The bezel area BZA is adjacent to the transmitting area TA and may encompass (e.g., surround or partially surround) the transmitting area TA.

The bezel area BZA may have a color (e.g., a predetermined color). When the window 100 is provided as a glass or plastic substrate, the bezel area BZA may be a color layer that is printed or deposited on one surface of the glass or plastic substrate. Alternatively, the bezel area BZA may also be defined by coloring a corresponding area of the glass or plastic substrate.

The bezel area BZA may cover a peripheral area NAA of the electronic panel 200 to block the peripheral area NAA from being viewed from the outside. The bezel area BZA that is depicted is illustrative only and other suitably shaped bezels may be used. The bezel area BZA may also be omitted from the window 100 in accordance with an embodiment of the inventive concept.

The electronic panel 200 may display the image IM and sense the external input TC. The electronic panel 200 includes the front surface IS that includes the active area AA and the peripheral area NAA. The active area AA may be activated in response to an electrical signal.

In the present embodiment, the active area AA may display the image IM while sensing the external input TC. The transmitting area TA overlaps at least the active area AA. For example, the transmitting area TA overlaps the front surface or the at least a portion of the active area AA. Accordingly, the user may view the image IM or provide the external input TC through the transmitting area TA. It should be understood that the depicted active area AA is illustrative only and any other suitable active area may be used. An area in which the image IM is displayed and that in which the external input TC is sensed may be separated from each other in the active area AA, but is not limited to any one embodiment.

The peripheral area NAA may be covered by the bezel area BZA. The peripheral area NAA is adjacent to the active area AA. The peripheral area NAA may encompass (e.g., surround or partially surround) the active area AA. The peripheral area NAA may have a driving circuit or a driving line that is configured to drive the active area AA.

The peripheral area NAA may have various types of signal lines or pads PD, or an electronic element disposed therein to provide an electrical signal to the active area AA. The peripheral area NAA may be prevented from being viewed from the outside by being covered by the bezel area BZA.

In the present embodiment, the electronic panel 200 is assembled in a flat state in which the active area AA and the peripheral area NAA face the window 100. The depicted electronic panel 200 is for illustrative purposes only, and the electronic panel 200 may have any suitable shape. For example, a portion of the peripheral area NAA of the electronic panel 200 may be bent. In this case, the portion of the peripheral area NAA is directed to the rear surface of the electronic apparatus EA, and the bezel area BZA of the front surface FS of the electronic apparatus EA may thus be reduced. Alternatively, the electronic panel 200 may be assembled while a portion of the active area AA is also bent. In an alternative manner, the peripheral area NAA may be omitted from the electronic panel 200 in accordance with an embodiment of the inventive concept.

Referring to FIG. 2, the electronic panel 200 may include a display unit 210 and a sensing unit 220. The display unit 210 may substantially generate the image IM. The image IM, generated by the display unit 210, is viewed from the outside by the user through the transmitting area TA.

The sensing unit 220 senses the external input TC that is applied from the outside. As described above, the sensing unit 220 may sense the external input TC that is provided to the window 100.

A hole area (e.g., a predetermined hole area) HA (or a first area) may be defined in the electronic panel 200. The hole area HA may have a relatively higher transmittance than the active area AA (or a second area). The hole area HA is in a position that overlaps the electronic module 400 on a plane as will be described later.

At least a portion of the hole area HA may be encompassed (e.g., surrounded or partially surrounded) by the active area AA. In the present embodiment, the hole area HA is spaced apart from the peripheral area NAA (or a third area). The hole area HA is illustrated as being in the active area AA such that all the edges of the hole area HA are encompassed (e.g., surrounded or partially surrounded) by the active area AA.

The electronic panel 200 may include a hole MH that is defined in the hole area HA to pass through the electronic panel 200. The hole MH may pass through at least one of the display unit 210 and/or the sensing unit 220. The edges of the hole area HA may be substantially spaced apart from an edge of the hole MH at an interval (e.g., a predetermined interval) and may extend along the edge of the hole MH. The edge of the hole MH may have a shape that corresponds to that of the hole MH.

The circuit board 300 may be connected to the electronic panel 200. The circuit board 300 may include a flexible printed circuit board CF and a mainboard MB. The flexible printed circuit board CF may include an insulating film and conductive lines that are mounted on the insulating film. The conductive lines are connected to the pads PD to electrically connect the circuit board 300 to the electronic panel 200.

In the present embodiment, the flexible printed circuit board CF may be assembled in a bent state. Accordingly, the main board MB may be disposed on a rear surface of the electronic panel 200 to be stably accommodated in a space provided by the external case 500. In the present embodiment, the flexible printed circuit board CF may also be omitted, and, in this case, the mainboard MB may also be directly connected to the electronic panel 200.

The mainboard MB may include signal lines and electronic elements. The electronic elements may be connected to the signal lines to be electrically connected to the electronic panel 200. The electronic elements generate various types of electrical signals, for example, a signal configured to generate the image IM and a signal configured to sense the external input TC, or process a sensed signal. Meanwhile, the mainboard MB may also be provided as a plurality of mainboards MB that respectively correspond to electrical signals to be generated and processed, but is not limited to any one embodiment.

The electronic module 400 is disposed on a lower side of the window 100. The electronic module 400 may overlap with the hole MH on the plane and/or may overlap the hole area HA. The electronic module 400 may receive the external input TC that is transferred through the hole area HA or may provide an output through the hole area HA.

The electronic module 400 may include a receiving unit that is configured to receive the external input TC or an output unit that is configured to output an output may overlap the hole area HA on a plane. The entirety or a part of the electronic module 400 may be accommodated in the hole area HA or the hole MH. In accordance with an embodiment of the inventive concept, the electronic module 400 may prevent an increase of the bezel area BZA by overlapping the active area AA.

Referring to FIG. 2, the electronic apparatus EA may include the electronic panel 200, a power supply module PM, a first electronic module EM1, and a second electronic module EM2. The electronic panel 200, the power supply module PM, the first electronic module EM1, and the second electronic module EM2 may be electrically connected to each other. FIG. 2 illustratively depicts the display unit 210 and the sensing unit 220 among components of the electronic panel 200.

The first electronic module EM1 and the second electronic module EM2 include various functional modules that are configured to operate the electronic apparatus EA. The first electronic module EM1 may be mounted (e.g., directly mounted) on a motherboard that is electrically connected to the electronic panel 200 or may be mounted on a separate board to be electrically connected to a motherboard through a connector.

The first electronic module EM1 may include a control module CM, a wireless communications module TM, an image input module IIM, an audio input module AIM, a memory MM, and an external interface IF. One or more of the modules may not be mounted on the motherboard and may be electrically connected to the motherboard through a flexible printed circuit board.

The control module CM controls the overall operation of the electronic apparatus EA. The control module CM may be a microprocessor. For example, the control module CM activates or deactivates the electronic panel 200. The control module CM may control other modules such as the image input module IIM and the audio input module AIM on the basis of a touch signal received from the electronic panel 200.

The wireless communications module TM may transmit a wireless signal to, or receive a wireless signal from, other terminals or devices by using a Bluetooth or a Wi-Fi circuit. The wireless communications module TM may transmit or receive an audio signal by using a general communications line. The wireless communications module TM includes a transmitting unit TM1 that is configured to modulate and transmit a signal, and a receiving unit TM2 that is configured to demodulate a received signal.

The image input module IIM processes an image signal to convert the processed image signal into image data that may be displayed on the electronic panel 200. The audio input module AIM receives an external audio signal by a microphone in a recording mode, a voice recognition mode, or the like and converts the received external audio signal into electrical voice data.

The external interface IF serves as an interface that is connected to an external charger, a wired or wireless data port, a card socket (for example, a memory card, a subscriber identity module (SIM) or user identification module (UIM) card), and the like.

The second electronic module EM2 may comprise an audio output module AOM, a light-emitting module LM, a light-receiving module LRM, and a camera module CMM. The components may be mounted (e.g., directly mounted) on a motherboard, mounted on a separate substrate to be electrically connected to the electronic panel 200 through a connector, or electrically connected to the first electronic module EM1.

The audio output module AOM converts audio data that is received from the wireless communications module TM or audio data that is stored in the memory MM and outputs the converted audio data to the outside.

The light-emitting module LM generates and outputs light. The light-emitting module LM may output infrared light. For example, the light-emitting module LM may include a light-emitting diode (LED) element. For example, the light-receiving module LRM may sense infrared light. The light-receiving module LRM may be activated when infrared light of a reference level (e.g., a predetermined level) or higher is sensed. The light-receiving module LRM may include a complementary metal-oxide semiconductor (CMOS) sensor. After the infrared light generated by the light-emitting module LM is output, the output infrared light may be reflected by an external subject (for example, the user's finger or face), and the reflected infrared light may be incident on the light-receiving module LRM. The camera module CMM captures an external image.

The electronic module 400, in accordance with an embodiment of the inventive concept, may include at least one of the components of the first electronic module EM1 or the second electronic module EM2. For example, the electronic module 400 may include at least a camera, a speaker, a light sensor, or a heat sensor. The electronic module 400 may sense the external subject that is received through the hole area HA or may receive an audio signal such as voice from the outside through the hole area HA. Further, the electronic module 400 may include a plurality of suitable components, and is not limited to any one embodiment.

The electronic module 400, overlapping with the hole area HA, may recognize the external object through the hole area HA, and/or an output signal generated by the electronic module 400 may be easily transmitted to the outside. Although not illustrated, the electronic apparatus EA in accordance with an embodiment of the inventive concept may also include a transparent member that is disposed between the electronic module 400 and the electronic panel 200. The transparent member may be an optically transparent film such that the external input TC transferred through the hole MH is delivered to the electronic module 400 through the transparent member. The transparent member may be attached to the rear surface of the electronic panel 200 or may be disposed between the electronic panel 200 and the electronic module 400 without a separate adhesive layer. The electronic apparatus EA, in accordance with an embodiment of the inventive concept, may have various structures, and is not limited to any one embodiment.

In accordance with an embodiment of the inventive concept, the electronic module 400 may be assembled to overlap the transmitting area TA on a plane. Accordingly, an increase of the bezel area BZA due to the accommodating of the electronic module 400 may be prevented, thereby increasing an aesthetic sense of the electronic apparatus EA.

Figure 3A:
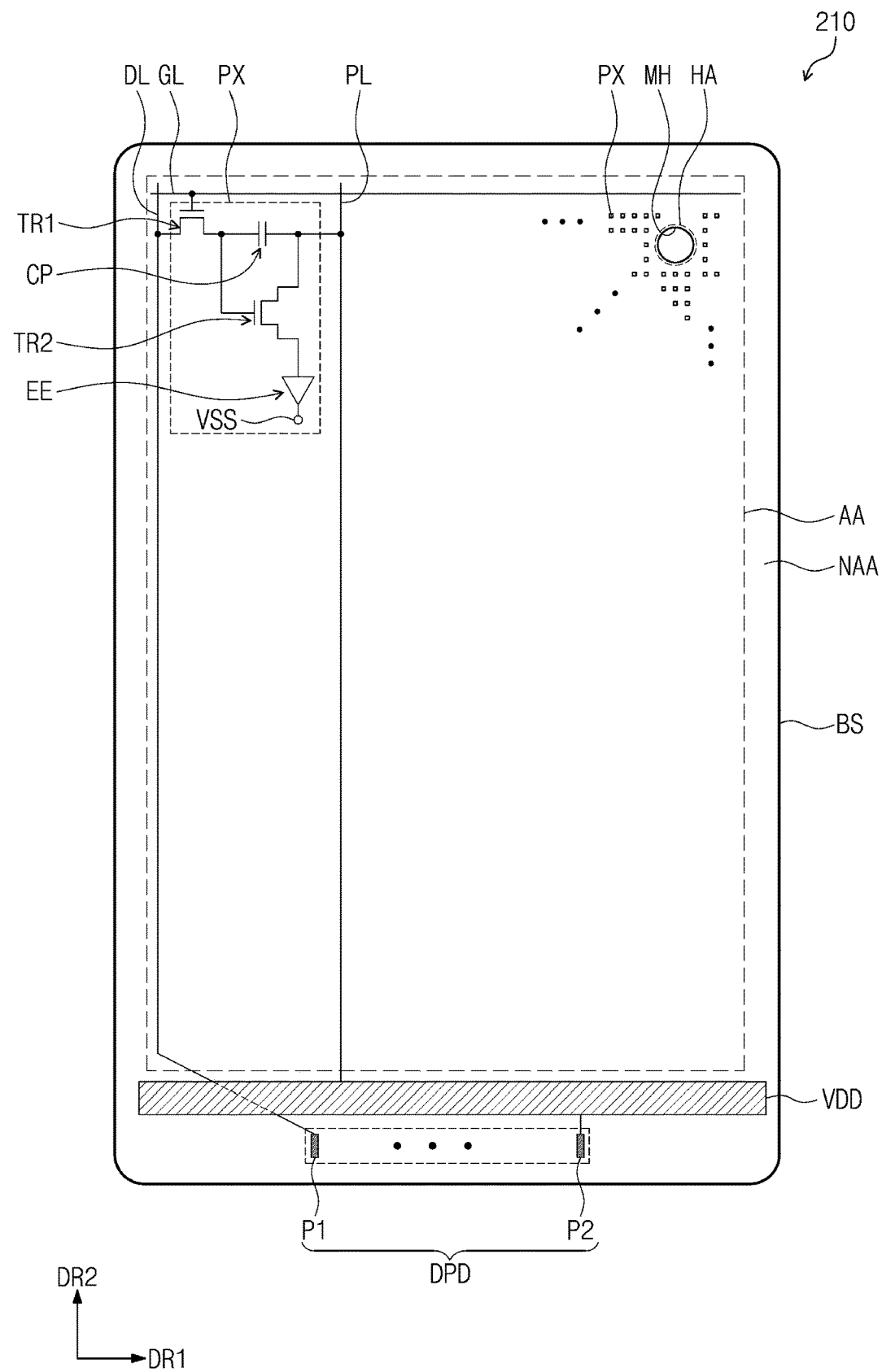
FIG. 3A is a plan view of a display unit in accordance with an embodiment of the inventive concept.
Figure 3B:
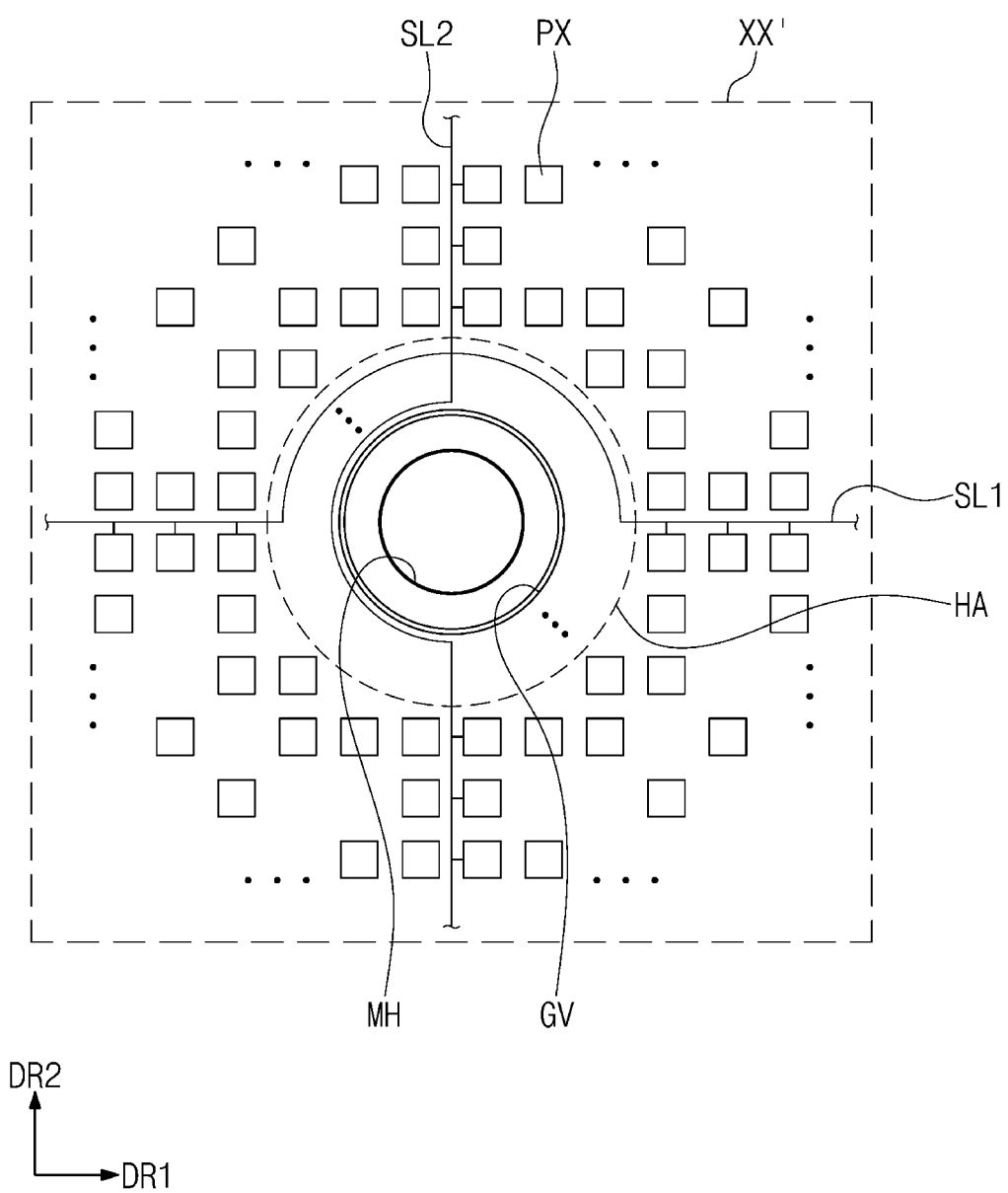
FIG. 3B is an enlarged view of a region illustrated in FIG. 3A.
Figure 3C:
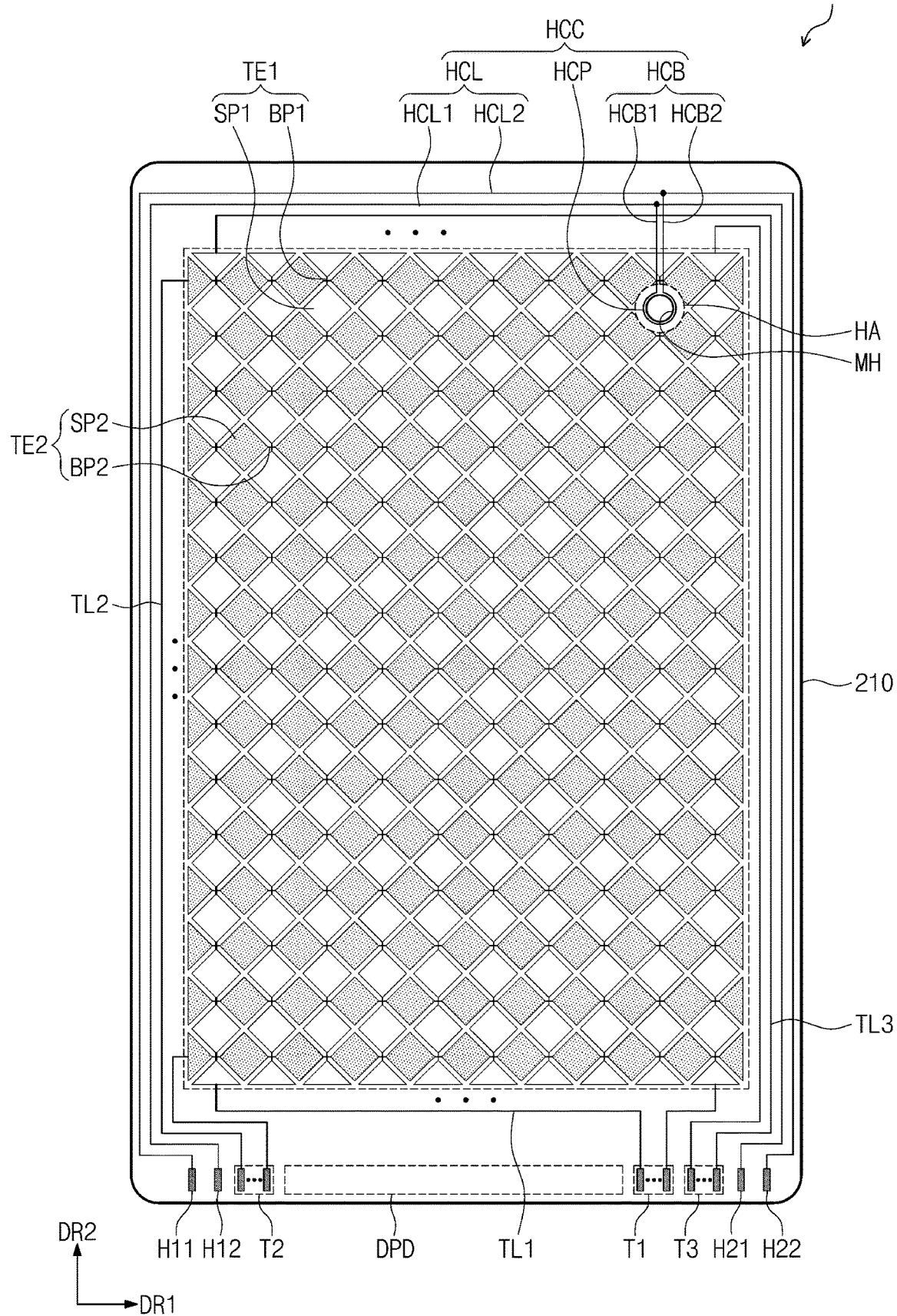
FIG. 3C is a plan view of a sensing unit in accordance with an embodiment of the inventive concept.

FIG. 3A is a plan view of a display unit in accordance with an embodiment of the inventive concept. FIG. 3B is an enlarged view of a region illustrated in FIG. 3A. FIG. 3C is a plan view of a sensing unit in accordance with an embodiment of the inventive concept.

FIG. 3A illustrates a schematic signal circuit diagram, and FIG. 3B illustrates an enlarged view of region XX' illustrated in FIG. 1B. For ease of explanation, a portion of components are omitted from FIGS. 3A-3C. Hereinafter, an embodiment of the inventive concept will be described with reference to FIGS. 3A-3C.

As illustrated in FIG. 3A, the display unit 210 includes a base substrate BS, a plurality of pixels PX, a plurality of signal lines GL, DL, and PL, and a plurality of display pads DPD.

The active area AA and the peripheral area NAA may be provided by the base substrate BS. The base substrate BS may include an insulating substrate. For example, the base substrate BS may be formed as a glass substrate, a plastic substrate, or a combination thereof.

The signal lines GL, DL, and PL are connected to the pixels PX to transmit electrical signals to the pixels PX. Scan lines GL, data lines DL, and power lines PL are illustratively depicted as the signal lines in the display unit 210. It should be understood that the signal lines GL, DL, and PL are illustrative only and any other suitable signal lines may be included. The signal lines GL, DL, and PL may also further include at least a power line, an initialization voltage line, or a light-emitting control line, but are not limited to any one embodiment.

In the present embodiment, a signal circuit diagram of one of the plurality of pixels PX is enlarged and illustratively depicted. The pixel PX may include a first thin-film transistor TR1, a capacitor CP, a second thin-film transistor TR2, and a light-emitting element EE.

In the present embodiment, the pixels PX may be disposed in the active area AA. It should be understood that the depicted pixels PX are illustrative only and any other suitable pixels may be used. A portion of components, excluding the light-emitting element EE, included in a portion of the pixels PX may also be disposed in the peripheral area NAA, but the pixels PX are not limited to any one embodiment.

The first thin-film transistor TR1 may be a switching element that is configured to control turn-on or turn-off of the pixel PX. The first thin-film transistor TR1 may transmit or block a data signal that is transmitted through the data line DL in response to a scan signal transmitted through the scan line GL.

The capacitor CP is connected to the first thin-film transistor TR1 and the power line PL. The capacitor CP is charged by an amount of charges that corresponds to the difference between the data signal transmitted from the first thin-film transistor TR1 and a first power signal applied to the power line PL.

The second thin-film transistor TR2 is connected to the first thin-film transistor TR1, the capacitor CP, and the light-emitting element EE. The second thin-film transistor TR2 controls a driving current that flows in the light-emitting element EE, in response to the amount of charges stored in the capacitor CP. A turn-on time of the second thin-film transistor TR2 may be determined according to the amount of charge stored in the capacitor CP. The second thin-film transistor TR2 provides, to the light-emitting element EE, the first power signal that is transmitted through the power line PL for the turn-on time.

The light-emitting element EE may generate light or control the amount of light in response to an electrical signal. For example, the light-emitting element EE may include an organic light-emitting element, a quantum dot light-emitting element, an electrophoretic element, an electrowetting element, or any other suitable light-emitting element as is understood by those skilled in the art.

The light-emitting element EE is connected to a power terminal VSS to receive a power signal (hereinafter referred to as a second power signal) different from the first power signal, which is provided by the power line PL. A driving current, corresponding to the difference between an electrical signal provided from the second thin-film transistor TR2 and the second power signal, flows through the light-emitting element EE, and the light-emitting element EE may generate light that corresponds to the driving current. It should be understood that the depicted pixels PX are illustrative only and other suitable embodiments of pixels may be used. The pixels PX may also each include electronic elements that have various components and arrangements, but are not limited to any one embodiment.

The pixels PX are disposed around the hole MH and may encompass (e.g., surround or partially surround) the hole MH on a plane. FIG. 3B illustrates the hole area HA by dotted lines for ease of explanation. Region XX' includes an area in which the hole MH is defined. Hereinafter, the display unit 210 will be described in the area in which the hole MH is disposed, with reference to FIG. 3B.

As described above, the hole MH may be defined in the active area AA. Accordingly, at least a portion of the pixels PX may be disposed adjacent to the hole MH. A portion of the pixels PX may encompass (e.g., surround or partially surround) the hole MH.

Meanwhile, the hole area HA may have a depression pattern (e.g., a predetermined depression pattern) GV defined therein. The depression pattern GV is disposed along the edge of the hole MH on a plane and is illustrated in the form of a circular ring that encompasses (e.g., surrounds or partially surrounds) the hole MH in the present embodiment. It should be understood that the depicted depression pattern GV is illustrative only and that any other suitable depression pattern may be used. The depression pattern GV may also have a shape that is different from that of the hole MH. For example, the depression pattern GV may have a closed-line shape that includes a polygon, an ellipse, or at least a curve, or a shape that includes a plurality of partially disconnected patterns, and is not limited to any one embodiment.

The depression pattern GV corresponds to a portion that is depressed from a front surface of the display unit 210, and blocks a passage through which moisture or oxygen able to permeate through the hole MH is flowed into pixel PX. The depression pattern GV will be detailed later.

The hole area HA may have a plurality of signal lines SL1 and SL2 disposed therein and connected to the pixels PX. The signal lines SL1 and SL2 are connected to the pixels PX via the hole area HA. FIG. 3B illustratively depicts a first signal line SL1 and a second signal line SL2 among the plurality of signal lines SL1 and SL2 that are connected to the pixels PX for easy of explanation.

The first signal line SL1 extends in the first direction DR1. The first signal line SL1 is connected to a portion of the pixels PX that are arranged in the first direction DR1 and may be in the same row. The first signal line SL1 is illustratively described as corresponding to the scan line GL.

A portion of the pixels connected to the first signal line SL1 are disposed on a left side of the hole MH around the hole MH, and the remainder of the pixels are disposed on a right side of the hole MH around the hole MH. Accordingly, the pixels, that are connected to the first signal line SL1 and may be in the same row, may be turned on or off by substantially the same gate signal even when a portion of the pixels around the hole MH are omitted.

The second signal line SL2 extends in the second direction DR2. The second signal line SL2 is connected to a portion of the pixels PX that are arranged in the second direction DR2 and may be in the same column. The second signal line SL2 is illustratively described as corresponding to the data line DL.

A portion of the pixels connected to the second signal line SL2 are disposed on an upper side of the hole MH around the hole MH, and the remainder of the pixels are disposed on a lower side of the hole MH around the hole MH. Accordingly, the pixels, that are connected to the second signal line SL2 and may be in the same column, and may receive a data signal even when a portion of the pixels around the hole MH are omitted.

The electronic panel 200 in accordance with an embodiment of the inventive concept may further include a connection pattern that is disposed in the hole area HA. In this case, the first signal line SL1 may be disconnected in an area in which the first signal line SL1 overlaps the hole area HA. Disconnected portions of the first signal line SL may be connected through the connection pattern. Similarly, the second signal line SL2 may be disconnected in an area in which the second signal line SL2 overlaps the hole area HA, and a connection pattern connecting disconnected portions of the second signal line SL2 may also be further provided.

Referring again to FIG. 3A, a power pattern VDD is disposed in the peripheral area NAA. In the present embodiment, the power pattern VDD is connected to a plurality of power lines PL. Accordingly, the display unit 210 may include the power pattern VDD, thereby providing the same first power signal to the plurality of pixels PX.

The display pads DPD may include a first pad P1 and a second pad P2. The first pad P1 may be provided as a plurality of first pads P1, which may be connected to the data lines DL, respectively. The second pad P2 may be connected to the power pattern VDD to be electrically connected to the power line PL. The display unit 210 may provide, to the pixels PX, electrical signals that are provided from the outside through the display pads DPD. Meanwhile, the display pads DPD may further include pads that are configured to receive electrical signals other than the first pad P1 and the second pad P2, but are not limited to any one embodiment.

Referring to FIG. 3C, the sensing unit 220 is disposed on the display unit 210. The sensing unit 220 may sense the external input TC (see FIG. 1A) to obtain information on the position or intensity of the external input TC. The sensing unit 220 includes a plurality of first sensing electrodes TE1, a plurality of second sensing electrodes TE2, a plurality of sensing lines TL1, TL2, and TL3, and a plurality of sensing pads T1, T2, and T3.

The first sensing electrodes TE1 and the second sensing electrodes TE2 are disposed in the active area AA. The sensing unit 220 may obtain information on the external input TC through a change in capacitance between the first sensing electrodes TE1 and the second sensing electrodes TE2.

The first sensing electrodes TE1 are arranged along the first direction DR1 and each extend in the second direction DR2. Each of the first sensing electrodes TE1 may include a first sensing pattern SP1 and a first connection pattern BP1.

The first sensing pattern SP1 is disposed in the active area AA. The first sensing pattern SP1 is spaced apart from the hole MH. The first sensing pattern SP1 has a shape (e.g., a predetermined shape) and has a first area. In the present embodiment, the first sensing pattern SP1 may have a rhombic shape. The first sensing pattern SP1 is illustratively depicted. The first sensing pattern SP1 may also have various shapes, and is not limited to any one embodiment.

The first connection pattern BP1 is disposed in the active area AA. The first connection pattern BP1 extends in the second direction DR2. The first connection pattern BP1 is connected to the first sensing pattern SP1. The first connection pattern BP1 may be disposed between two of the first sensing patterns SP1 to connect the two first sensing patterns SP1.

The second sensing electrodes TE2 are arranged along the second direction DR2 and each extend in the first direction DR1. Each of the second sensing electrodes TE2 may include a second sensing pattern SP2 and a second connection pattern BP2.

The second sensing pattern SP2 is spaced apart from the hole MH. The second sensing pattern SP2 may be spaced from the first sensing pattern SP1. In the present embodiment, the separation between the first sensing pattern SP1 and the second sensing pattern SP2 may be on a cross section. The first sensing pattern SP1 and the second sensing pattern SP2 may transmit and receive independent electrical signals in noncontact with each other.

In the present embodiment, the second sensing pattern SP2 may have the same shape as the first sensing pattern SP1. For example, the second sensing pattern SP2 may have a rhombic shape. The second sensing pattern SP2 is illustratively depicted. The second sensing pattern SP2 may also have various shapes, and is not limited to any one embodiment.

Sensing patterns adjacent to the hole area HA, among the first sensing patterns SP1 and the second sensing patterns SP2, may have shapes that are different from sensing patterns that are away from the hole area HA. In the present embodiment, the hole area HA is an area that is encompassed (e.g., surrounded) by four of the second sensing patterns SP2. Accordingly, each of the four second sensing patterns SP2 adjacent to the hole area HA has a shape in which a portion of the second sensing patterns SP2 adjacent to each other is removed. It should be understood that the depicted second sensing patterns SP2 are illustrative only and that any suitable sensing patterns may be used. The first sensing patterns SP1 may each have a shape in which a portion of the first sensing patterns SP1 is removed according to the position of the hole area HA, and the first sensing patterns SP1 and second sensing patterns SP2 are not limited to any one embodiment.

The sensing lines TL1, TL2 and TL3 are disposed in the peripheral area NAA. The sensing lines TL1, TL2 and TL3 may include first sensing lines TL1, second sensing lines TL2, and third sensing lines TL3.

The first sensing lines TL1 are connected to the first sensing electrodes TE1, respectively. In the present embodiment, the first sensing lines TL1 are connected to lower ends of both ends of the first sensing electrodes TE1, respectively.

The second sensing lines TL2 are connected to first ends of the second sensing electrodes TE2, respectively. In the present embodiment, the second sensing lines TL2 are connected to left ends of both ends (e.g., both first and second ends) of the second sensing electrodes TE2, respectively.

In the present embodiment, the third sensing lines TL3 are connected to upper ends of both ends of the first sensing electrodes TE1, respectively. In accordance with an embodiment of the inventive concept, the first sensing electrodes TE1 may be connected to the first sensing lines TL1 and the third sensing lines TL3. Accordingly, the sensitivity of the first sensing electrodes TE1 having a relatively greater length than that of the second sensing electrodes TE2 may be uniformly maintained according to areas of the first sensing electrodes TE1. It should be understood that the depicted sensing lines TL1, TL2 and TL3 are illustrative only and that any suitable sensing lines may be used. The third sensing lines TL3 may also be omitted from the sensing unit 220 in accordance with an embodiment of the inventive concept, and the sensing lines TL1, TL2 and TL3 are not limited to any one embodiment.

Sensing pads T1, T2, and T3 are disposed in the peripheral area NAA. The sensing pads T1, T2, and T3 may include first sensing pads T1, second sensing pads T2, and third sensing pads T3. The first sensing pads T1 are connected to the first sensing lines TL1, respectively, to provide an external signal to the first sensing electrodes TE1. The second sensing pads T2 are connected to the second sensing lines TL2, respectively, and the third sensing pads T3 are connected to the third sensing lines TL3, respectively, to be electrically connected to the second sensing electrodes TE2.

Meanwhile, the sensing unit 220 in accordance with an embodiment of the inventive concept may further include a crack sensor HCC. The crack sensor HCC receives an electrical signal that is independent from the first sensing electrodes TE1 and the second sensing electrodes TE2. The crack sensor HCC may include a crack sensing pattern HCP, a crack sensing line HCL, and a connection line HCB that are connected to each other.

The crack sensing pattern HCP may be disposed in the hole area HA. The crack sensing pattern HCP extends along the edge of the hole area HA in the hole area HA. The crack sensing pattern HCP may have an open curve shape that includes a first end and a second end. In the present embodiment, the crack sensing pattern HCP has a shape that encompasses (e.g., surrounds or partially surrounds) the edge of the hole MH.

The crack sensing pattern HCP includes a conductive material. The crack sensing pattern HCP may have conductivity. In the present embodiment, the crack sensing pattern HCP may have an integral shape.

The crack sensing line HCL is disposed in the peripheral area NAA. In the present embodiment, the crack sensing line HCL is illustrated as being disposed further outward than the first to third sensing lines TL1, TL2, and TL3.

The crack sensing line HCL includes a first line HCL1 and a second line HCL2. The first line HCL1 and the second line HCL2 are spaced apart from each other.

The first line HCL1 and the second line HCL2 are connected to corresponding pads from among first to fourth pads H11, H12, H21, and H22. For example, a first end of the first line HCL1 is connected to the second pad H12, and a first end of the second line HCL2 is connected to the first pad H11. The first pad H11 and the second pad H12 are illustratively depicted as being disposed on a left side of an area in which the display pads DPD are disposed.

A second end of the first line HCL1 is connected to the third pad H21, and a second end of the second line HCL2 is connected to the fourth pad H22. The third pad H21 and the fourth pad H22 are illustratively depicted as being disposed on a right side of the area in which the display pads DPD are disposed. The first pad H11 and the second pad H12 are spaced apart from the third pad H21 and the fourth pad H22 with the display pads DPD therebetween.

In accordance with an embodiment of the inventive concept, whether damage such as a crack has occurred in the hole area HA or the peripheral area NAA may be determined using the crack sensor HCC. The first pad H11 and the third pad H21 of the crack sensor HCC may be input terminals, and the second pad H12 and the fourth pad H22 thereof may be output terminals.

An electrical signal received from the first pad H11 may pass through the crack sensing pattern HCP via the second line HCL2. Then, the electrical signal output from the crack sensing pattern HCP is output to the second pad H12 via the first line HCL1.

Likewise, an electrical signal received through the third pad H21 may pass through the crack sensing pattern HCP via the second line HCL2. Then, the electrical signal output from the crack sensing pattern HCP is output to the fourth pad H22 via the second line HCL2.

A signal sensed at the second pad H12 and the fourth pad H22 may be used to determine if the first and second lines HCL1 and HCL2 are damaged. For example, when a signal sensed by each of the second pad H12 and the fourth pad H22 is detected as being a defective signal (e.g., such as a level lower than that of a reference signal or a zero-level value), it may be because the first and second lines HCL1 and HCL2 are damaged or the crack sensing pattern HCP is damaged. Thus, whether a crack has occurred in the hole area HA may be determined.

Alternatively, when a signal sensed only at the second pad H12 or only at the fourth pad H22 is not detected as a defective signal (e.g., a normal signal that is greater than or equal to a reference signal), it may be because that the crack sensing line HCL is damaged. Thus, whether a crack has occurred in the peripheral area NAA may be determined. It should be understood that the first to fourth pads H11, H12, H21, and H22 have been exemplarily described and that suitable other embodiments understood by those skilled in the art may be utilized. The first pad H11 and the third pad H21 may serve as output terminals, and the second pad H12 and the fourth pad H22 may serve as input terminals. However, the first to fourth pads H11, H12, H21, and H22 are not limited to any one embodiment.

The crack sensor HCC in accordance with an embodiment of the inventive concept may further include the connection line HCB. The connection line HCB connects the crack sensing pattern HCP to the crack sensing line HCL via the active area AA. In the present embodiment, the hole area HA is defined by being spaced apart from the peripheral area NAA with a portion of the active area AA between the hole area HA and the peripheral area NAA.

For example, the connection line HCB includes a first connection line HCB1 and a second connection line HCB2 that are spaced apart from each other. The first connection line HCB1 connects the first line HCL1 to the crack sensing pattern HCP. The second connection line HCB2 connects the second line HCL2 to the crack sensing pattern HCP.

In the present embodiment, the connection line HCB may be spaced apart from first and second main patterns SP1 and SP2 of overlapping patterns from among the first sensing electrodes TE1 and the second sensing electrodes TE2 on a plane. Accordingly, the connection line HCB may be electrically insulated from the first sensing electrodes TE1 or the second sensing electrodes TE2. The connection line HCB will be detailed later.

By further including the crack sensor HCC in an embodiment of the inventive concept, whether a defect has occurred in the sensing unit 220, particularly in the hole area HA, may be determined (e.g., sensed easily). Accordingly, the reliability of the electronic apparatus EA may be improved, and whether the electronic apparatus EA is defective may be determined without a separate inspection circuit or inspection device, thereby increasing process efficiency.

Figure 4:
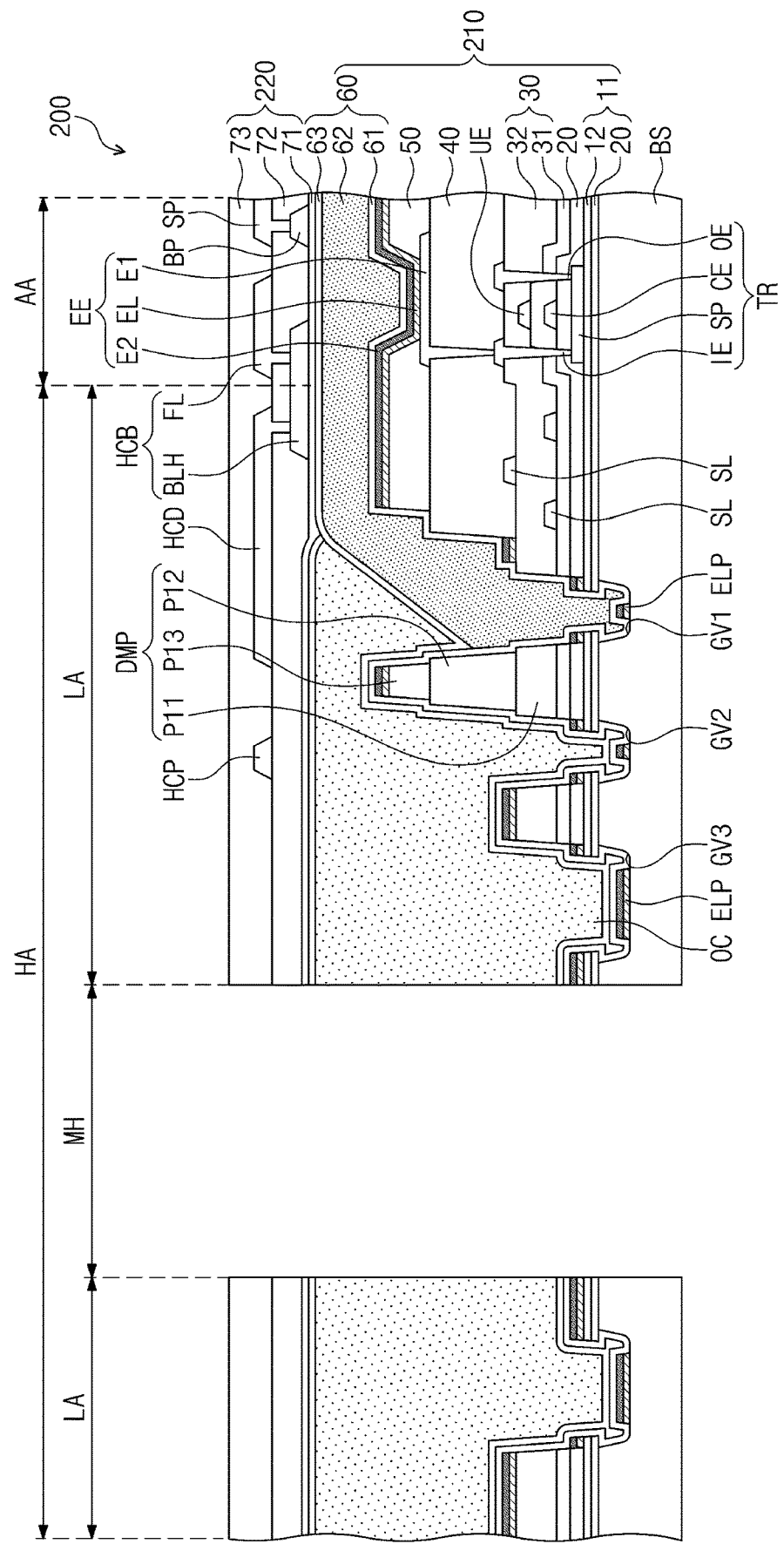
FIG. 4 is a cross-sectional view of a region of an electronic panel in accordance with an embodiment of the inventive concept.

FIG. 4 is a cross-sectional view of a region of an electronic panel in an embodiment of the inventive concept. Hereinafter, an embodiment of the inventive concept will be described with reference to FIG. 4. The same components as those described in FIGS. 1A-3C are denoted by the same reference numerals, and a duplicate description thereof may be omitted.

As illustrated in FIG. 4, the display unit 210 and the sensing unit 220 of the electronic panel 200 may be stacked in the third direction DR3. The display unit 210 includes the base substrate BS, the pixel PX, a plurality of insulating layers 10, 20, 30, 40, and 50, and an encapsulation layer 60.

As described above, the base substrate BS may be an insulating substrate. For example, the base substrate BS may include a plastic substrate or a glass substrate.

In the present embodiment, a thin-film transistor TR (hereinafter referred to as a thin-film transistor) and a light-emitting element EE that correspond to the second thin-film transistor TR2 of the components of an equivalent circuit diagram of the pixel PX illustrated in FIG. 3A are illustratively depicted. The insulating layers 10, 20, 30, 40, and 50 may include first to fifth insulating layers 10, 20, 30, 40, and 50 that are stacked (e.g., sequentially stacked). Each of the first to fifth insulating layers 10, 20, 30, 40, and 50 may include an organic and/or inorganic material and may have a single-layer or a stacked structure.

The first insulating layer 10 is disposed on the base substrate BS to cover a front surface of the base substrate BS. The first insulating layer 10 may include a barrier layer 11 and/or a buffer layer 12. Accordingly, the first insulating layer 10 may prevent oxygen or moisture that has flowed through the base substrate BS from permeating into the pixel PX or reduce the surface energy of the base substrate BS such that the pixel PX may be stably formed on the base substrate BS.

It should be understood that the first insulating layer 10 is illustrative only and that any suitable layer may be used. At least one of the barrier layer 11 or the buffer layer 12 of the electronic panel 200 in accordance with an embodiment of the inventive concept may be omitted. In accordance with an embodiment of the inventive concept, at least one of the barrier layer 11 or the buffer layer 12 may have a structure in which a plurality of layers are stacked. However, the first insulating layer 10 is not limited to any one embodiment.

The thin-film transistor TR is disposed on the first insulating layer 10. The thin-film transistor TR includes a semiconductor pattern SP, a control electrode CE, an input electrode IE, and an output electrode OE. The semiconductor pattern SP is disposed on the first insulating layer 10. The semiconductor pattern SP may include a semiconductor material. The control electrode CE is spaced apart from the semiconductor pattern SP with the second insulating layer 20 therebetween. The control electrode CE may be connected to the first thin-film transistor TR1 (see FIG. 3A) and one electrode of the capacitor CP (see FIG. 3A), which are described above.

The input electrode IE and the output electrode OE are disposed on the third insulating layer 30 and spaced from each other on a plane. The input electrode IE and the output electrode OE pass through the first insulating layer 10, the second insulating layer 20, and the third insulating layer 30 to be connected to one side and the other side of the semiconductor pattern SP (e.g., opposite sides of the semiconductor pattern SP), respectively.

The display unit 210 in accordance with an embodiment of the inventive concept may further include an upper electrode UE. In the present embodiment, the third insulating layer 30 is illustrated as including a lower layer 31 and an upper layer 32. It should be understood that the depicted third insulating layer 30 is illustrative only and that any other suitable layer may be used. The third insulating layer 30 in accordance with an embodiment of the inventive concept may have a single-layer structure or a multi-layer structure, and is not limited to any one embodiment.

The upper electrode UE is disposed between the lower layer 31 and the upper layer 32. The upper electrode UE may overlap the control electrode CE on a plane. In the present embodiment, the upper electrode UE may receive the same electrical signal as that received by the control electrode CE or may receive an electrical signal different from that received by the control electrode CE to serve as the one electrode of the capacitor CP. It should be understood that the depicted upper electrode UE is illustrative only and that any other suitable configuration may be used. The upper electrode UE of the electronic panel 200 in accordance with an embodiment of the inventive concept may be omitted, and is not limited to any one embodiment.

The fourth insulating layer 40 is disposed on the third insulating layer 30 to cover the input electrode IE and the output electrode OE. The semiconductor pattern SP of the thin-film transistor TR may also be disposed on the control electrode CE. Alternatively, the semiconductor pattern SP may be disposed on the input electrode IE and the output electrode OE. In an alternative embodiment, the input electrode IE and the output electrode OE may be disposed on the same layer as the semiconductor pattern SP and be directly connected to the semiconductor pattern SP. The thin-film transistor TR, in accordance with an embodiment of the inventive concept, may be formed as various structures, and is not limited to any one embodiment.

The light-emitting element EE is disposed on the fourth insulating layer 40. The light-emitting element EE includes a first electrode E1, an organic layer EL, and a second electrode E2. The light-emitting element EE substantially defines light-emitting areas in the active area AA.

The first electrode E1 may be connected to the thin-film transistor TR through the fourth insulating layer 40.

Although not illustrated, the electronic panel 200 may also further include a separate connection electrode that is disposed between the first electrode E1 and the thin-film transistor TR. In this case, the first electrode E1 may be electrically connected to the thin-film transistor TR through the connection electrode.

The fifth insulating layer 50 is disposed on the fourth insulating layer 40. The fifth insulating layer 50 may include an organic and/or inorganic material and may have a single-layer or a stacked structure. The fifth insulating layer 50 may have opening portions defined therein. The opening portions expose at least a portion of the first electrode E1. The respective opening portions may substantially correspond to the light-emitting areas. The fifth insulating layer 50 may be a pixel definition film.

The organic layer EL is disposed between the first electrode E1 and the second electrode E2. The organic layer EL may include at least one light-emitting layer. For example, the organic layer EL may be formed of a material for emitting at least one of red light, green light, blue light and/or any other suitable color of light and may include a fluorescent or phosphorescent material. The organic layer EL may include an organic or inorganic light-emitting material. The organic layer EL may emit light in response to a potential difference between the first electrode E1 and the second electrode E2.

In the present embodiment, the organic layer EL is illustrated as having an integral shape overlapping the opening portions. It should be understood that the depicted organic layer EL is illustrative only and that other any suitable organic layer may be used. The organic layer EL may also be provided as a plurality of patterns that correspond to the respective opening portions, but is not limited to any one embodiment.

The organic layer EL may further include a charge control layer other than the at least one light-emitting layer. The charge control layer controls the movement of charges to increase the luminous efficiency and lifetime of the light-emitting element EE. In this case, the organic layer EL may include at least a hole transporting material, a hole injecting material, an electron transporting material, and/or an electron injecting material.

The second electrode E2 is disposed on the organic layer EL. The second electrode E2 may oppose the first electrode E1 (e.g., the first electrode E1 and the second electrode E2 may be at opposite sides of the organic layer EL). The second electrode E2 may have an integral shape that extends from the active area AA to the peripheral area NAA. The second electrode E2 may be commonly provided to the plurality of pixels PX. The light-emitting element EE disposed in each of the pixels PX receives a common power supply voltage (hereinafter referred to as a second power supply voltage) through the second electrode E2.

The second electrode E2 may include a transmissive conductive material or a transflective conductive material. Accordingly, light generated by the light-emitting pattern EP may be easily emitted through the second electrode E2 in the third direction DR3. It should be understood that the depicted light-emitting element EE is illustrative only and that any other suitable light-emitting element may be used. The light-emitting element EE in accordance with an embodiment of the inventive concept may also be driven in a bottom-emitting structure in which the first electrode E1 includes a transmissive or transflective material or in a double side-emitting structure in which light is emitted at both the front and the bottom, according to a design of the light-emitting element EE. However, the light-emitting element EE is not limited to any one embodiment.

The encapsulation layer 60 is disposed on the light-emitting element EE to encapsulate the light-emitting element EE. Although not illustrated, a capping layer configured to cover the second electrode E2 may be further disposed between the second electrode E2 and the encapsulation layer 60.

The encapsulation layer 60 may include a first inorganic layer 61, an organic layer 62, and a second inorganic layer 63 that are stacked (e.g., sequentially stacked) in the third direction DR3. The encapsulation layer 60 may further include a plurality of inorganic and organic layers, but is not limited thereto.

The first inorganic layer 61 may cover the second electrode E2. The first inorganic layer 61 may prevent external moisture or oxygen from permeating into the light-emitting element EE. For example, the first inorganic layer 61 may include silicon nitride, silicon oxide, or a combination thereof. The first inorganic layer 61 may be formed through a chemical vapor deposition process.

The organic layer 62 may be disposed on the first inorganic layer 61 to be in contact with the first inorganic layer 61. The organic layer 62 may provide a planar surface on the first inorganic layer 61. Bumps formed on an upper surface of the first inorganic layer 61 or particles present on the first inorganic layer 61 are covered by the organic layer 62, thereby blocking the influence of a surface state of the upper surface of the first inorganic layer 61 on the components provided on the organic layer 62. Further, the organic layer 62 may relieve the stress between layers that are in contact therewith. The organic layer 62 may include an organic material and may be formed through a solution process such as a spin coating process, a slit coating process, or an inkjet process.

The second inorganic layer 63 is disposed on the organic layer 62 to cover the organic layer 62. The second inorganic layer 63 may be stably formed on a relatively flat surface than disposed on the first inorganic layer 61. The second inorganic layer 63 encapsulates water or the like that is released from the organic layer 62 to prevent the water or the like from flowing to the outside. The second inorganic layer 63 may include silicon nitride, silicon oxide, or a combination thereof. The second inorganic layer 63 may be formed through a chemical vapor deposition process.

In the present embodiment, the hole area HA may include the hole MH and a wiring area LA. The wiring area LA may be between the hole MH and the active area AA. The wiring area LA may encompass (e.g., surround or partially surround) the hole MH on a plane. The light-emitting element EE or the thin-film transistor TR disposed in the active area AA may be omitted from the wiring area LA. Accordingly, the wiring area LA may have a relatively high transmittance compared to the active area AA.

Groove portions GV1, GV2, and GV3, and a dam portion DMP of the display unit 210 may be disposed in the wiring area LA.

The groove portions GV1, GV2, and GV3 may be spaced apart from each other. The groove portions GV1, GV2 and GV3 are illustratively depicted as first to third groove portions GV1, GV2, and GV3 that are sequentially formed in a direction spaced apart from the active area AA and approaching the hole MH. Each of the first to third groove portions GV1, GV2, and GV3 may have a closed-line shape that encompasses (e.g., surrounds) the hole MH or have an intermittent line shape that encompasses (e.g., surrounds or partially surrounds) at least a portion of the edge of the hole MH, but is not limited to any one embodiment.

Each of the groove portions GV1, GV2, and GV3 is defined by being depressed from an upper surface of the base substrate BS. Each of the groove portions GV1, GV2, and GV3 may be formed by removing at least a portion of the base substrate BS. A deposition pattern ELP may be disposed in each of the groove portions GV1, GV2, and GV3 and may be covered by at least one of the first inorganic layer 61 or the second inorganic layer 63.

The electronic panel 200, in accordance with an embodiment of the inventive concept, further includes the groove portions GV1, GV2, and GV3, thereby blocking the continuity between the deposition pattern ELP and the light-emitting element EE. Accordingly, the electronic panel 200 may block a permeation path for external moisture or oxygen to prevent damage to the elements that are disposed in the active area AA.

Further, the deposition pattern ELP disposed in each of the groove portions GV1, GV2, and GV3 may be covered by the first inorganic layer 61 or the second inorganic layer 63, thereby preventing the deposition pattern ELP from moving to and affecting other elements during a process of manufacturing the electronic panel 200. Accordingly, the process reliability of the electronic panel 200 may be increased. It should be understood that the depicted groove portions GV1, GV2, and GV3 are illustrative only and that any suitable number of groove portions and sizes of groove portions may be used. The groove portions GV1, GV2, and GV3 may also be provided as a single groove portion or omitted, but are not limited to any one embodiment.

The dam portion DMP is disposed in the wiring area LA to define a formation area for the organic layer 62 as a predetermined area, thereby preventing the organic layer 62 from being further extended. The dam portion DMP may be provided as a plurality of dam portions DMP, which are disposed between the groove portions GV1, GV2, and GV3. The dam portion DMP is illustrated as a stacked structure that includes first to third layers P11, P12, and P13. It should be understood that the depicted dam portion DMP is illustrative only and that any suitable dam portion may be used. The dam portion DMP may also have a single-layer structure, and is not limited to any one embodiment.

The electronic panel 200, in accordance with an embodiment of the inventive concept, may further include a planarization layer OC. The planarization layer OC includes an organic material. The planarization layer OC is disposed in the hole area HA. The planarization layer OC covers a nonplanar surface that is defined in the hole area HA by the dam portion DMP or the groove portions GV1, GV2, and GV3, and provides a planar surface on an upper portion of the planarization layer OC. Accordingly, the planar surface may be stably provided (e.g., provide a stable surface) even in an area of the hole area HA in which the organic layer 62 is not disposed. It should be understood that the depicted planarization layer OC is illustrative only and that any other suitable surface may be used. The planarization layer OC of the electronic panel 200 in accordance with an embodiment of the inventive concept may also be omitted.

The sensing unit 220 may include a plurality of conductive patterns HCP, HCB, BP, and SP and a plurality of sensing insulating layers 71, 72, and 73. The sensing insulating layers 71, 72, and 73 are illustratively depicted as comprising first to third sensing insulating layers 71, 72, and 73 that are sequentially stacked in the third direction DR3.

The first sensing insulating layer 71 covers the planarization layer OC. In the present embodiment, the first sensing insulating layer 71 may cover an upper surface of the planarization layer OC in the hole area HA and may cover an upper surface of the second inorganic layer 63 in the active area AA. The conductive patterns HCP, HCB, BP, and SP are disposed on the first sensing insulating layer 71.

The second sensing insulating layer 72 and the third sensing insulating layer 73 may have integral shapes that overlap the hole area HA and the active area AA. The conductive patterns HCP, HCB, BP, and SP may be covered by the third sensing insulating layer 73.

Each of the first to third sensing insulating layers 71, 72, and 73 may include an inorganic and/or organic film. In the present embodiment, each of the first to third sensing insulating layers 71, 72, and 73 is illustrated as a single layer. Each of the first to third sensing insulating layers 71, 72, and 73 may also have a stacked structure that includes a plurality of layers being in contact with each other, but is not limited to any one embodiment.

The conductive patterns HCP, HCB, BP, and SP may include the crack sensing pattern HCP, the connection line HCB, a connection pattern BP, and a sensing pattern SP. At least a portion of the conductive patterns HCP, HCB, BP, and SP may constitute the first and second sensing electrodes TE1 and TE2 (see FIG. 3C) or the crack sensor HCC (see FIG. 3C).

The sensing pattern SP is disposed in the active area AA. In the present embodiment, the sensing pattern SP may constitute the first main pattern SP1 (see FIG. 3C) or the second main pattern SP2 (see FIG. 3C).

The connection pattern BP is disposed in the active area AA. The connection pattern BP may be disposed between the first sensing insulating layer 71 and the second sensing insulating layer 72. The connection pattern BP is disposed on a different layer from the sensing pattern SP.

In the present embodiment, the connection pattern BP may be the first connection pattern BP1 (see FIG. 3C) or the second connection pattern BP2 (see FIG. 3C). The sensing pattern SP is illustrated as being connected to the connection pattern BP to be connected to another sensing pattern SP that is adjacent thereto.

In the present embodiment, it is illustrated that most of the first sensing electrodes TE1 (see FIG. 3C) and the second sensing electrodes TE2 (see FIG. 3C) are illustrated as being disposed between the second sensing insulating layer 72 and the third sensing insulating layer 73 and that the first connection pattern BP1 or the second connection pattern BP2 is disposed on a different layer from the second and third sensing insulating layers 72 and 73 to connect ones of the sensing patterns SP adjacent thereto. It should be understood that the depicted first sensing electrodes TE1 and the second sensing electrodes TE2 are illustrative only and that any other suitable sensing electrodes may be used. The first sensing electrodes TE1 and the second sensing electrodes TE2 may also be disposed on a different layer, but are not limited to any one embodiment.

The crack sensing pattern HCP is disposed in the hole area HA. The crack sensing pattern HCP is spaced apart from the sensing pattern SP. Accordingly, the crack sensing pattern HCP may receive an electrical signal that is independent from the sensing pattern SP to be operated separately from the sensing pattern SP. In the present embodiment, the crack sensing pattern HCP may be disposed on the planarization layer OC. The crack sensing pattern HCP is disposed on the same layer as the sensing pattern SP. The crack sensing pattern HCP is disposed between the second sensing insulating layer 72 and the third sensing insulating layer 73.

The crack sensing pattern HCP and the sensing pattern SP may be formed (e.g., simultaneously or continuously formed) through a single mask, thereby simplifying the process and reducing the process cost. It should be understood that the depicted crack sensing pattern HCP is illustrative only and that any suitable crack sensing pattern may be used. The crack sensing pattern HCP may also be disposed on a different layer from the sensing pattern SP, and is not limited to any one embodiment.

The connection line HCB extends to the peripheral area NAA (see FIG. 3C) to connect the crack sensing line HCL (see FIG. 3C) and the crack sensing pattern HCP. The connection line HCB may include a hole connection portion BLH and a floating portion FL. The hole connection portion BLH and the floating portion FL may be disposed on different layers from each other.

The hole connection portion BLH connects the crack sensing pattern HCP to the floating portion FL. The hole connection portion BLH may be disposed on a different layer from the crack sensing pattern HCP. The hole connection portion BLH is disposed between the first sensing insulating layer 71 and the second sensing insulating layer 72. The crack sensing pattern HCP may be connected to the hole connection portion BLH through the second sensing insulating layer 72.

The floating portion FL is disposed on the same layer as the sensing pattern SP. The floating portion FL may be spaced apart from the sensing pattern SP on a plane. Accordingly, the floating portion FL may be electrically insulated from the sensing pattern SP.

The floating portion FL is disposed on the same layer as the crack sensing pattern HCP. The floating portion FL is electrically connected to the crack sensing pattern HCP through the hole connection portion BLH. Accordingly, even when a different component, for example, the second connection pattern BP2, configured to transmit a signal different from that transmitted from the crack sensing pattern HCP, is disposed between the floating portion FL and the crack sensing pattern HCP, which are disposed on the same layer, the crack sensing pattern HCP and the floating portion FL may be stably connected. The floating portion FL of the crack sensor HCC, in accordance with an embodiment of the inventive concept, may also be directly connected to the crack sensing pattern HCP. In this case, the hole connection portion BLH may be formed as only the floating portion FL, but is not limited to any one embodiment.

In accordance with an embodiment of the inventive concept, the crack sensing pattern HCP may be disposed in the hole area HA and be configured to sense whether a crack has occurred in the hole area HA. Further, because the connection line HCB includes the floating portion FL that is disposed at the same layer as the sensing pattern SP, the crack sensing pattern HCP and the crack sensing line HCL may be stably connected on the same layer as the sensing pattern SP without an electrical interference between the crack sensing pattern HCP or the crack sensing line HCL and the sensing pattern SP.

Figure 5A:
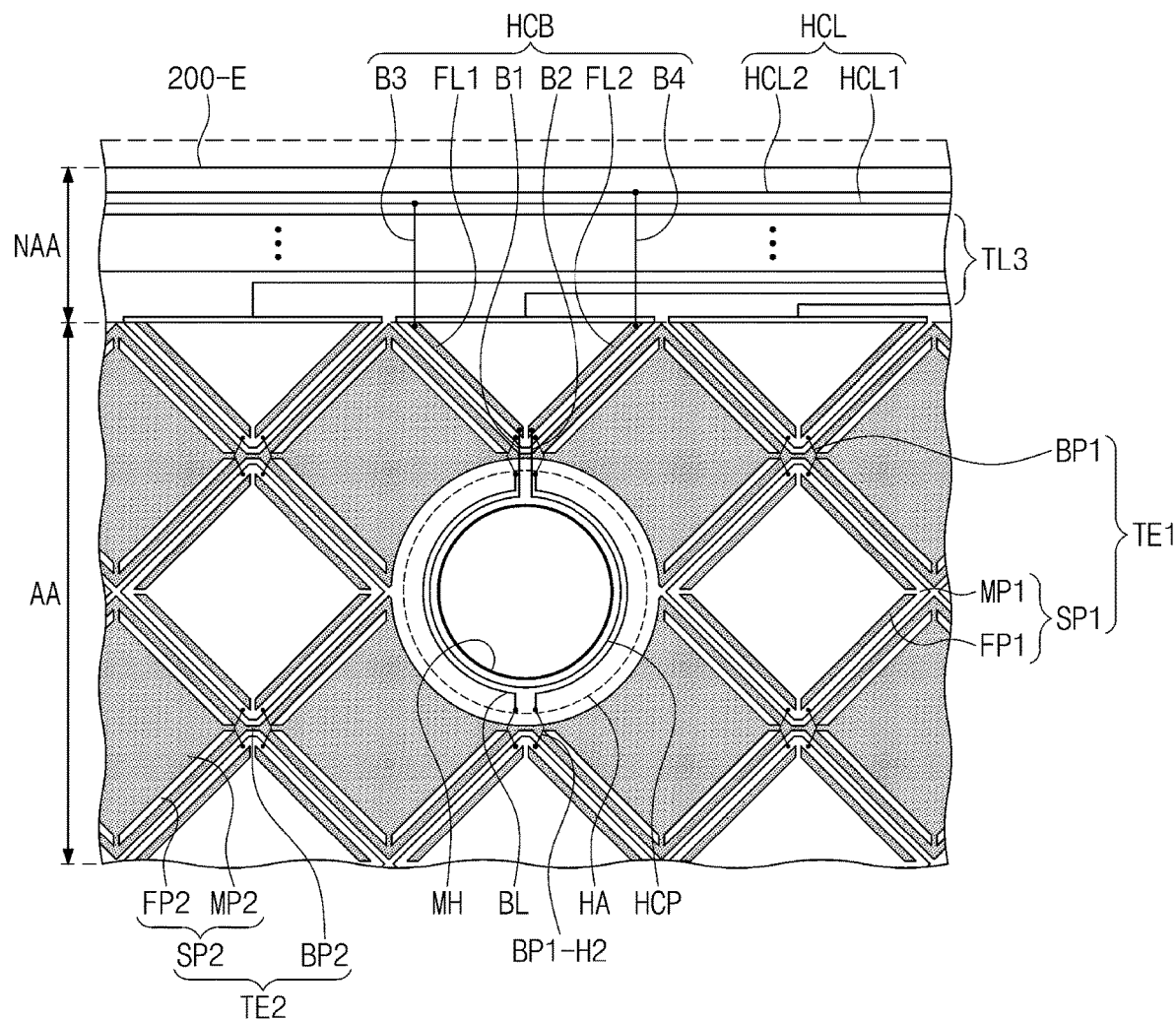
FIG. 5A is a plan view of a region of an electronic panel in accordance with an embodiment of the inventive concept.
Figure 5B:
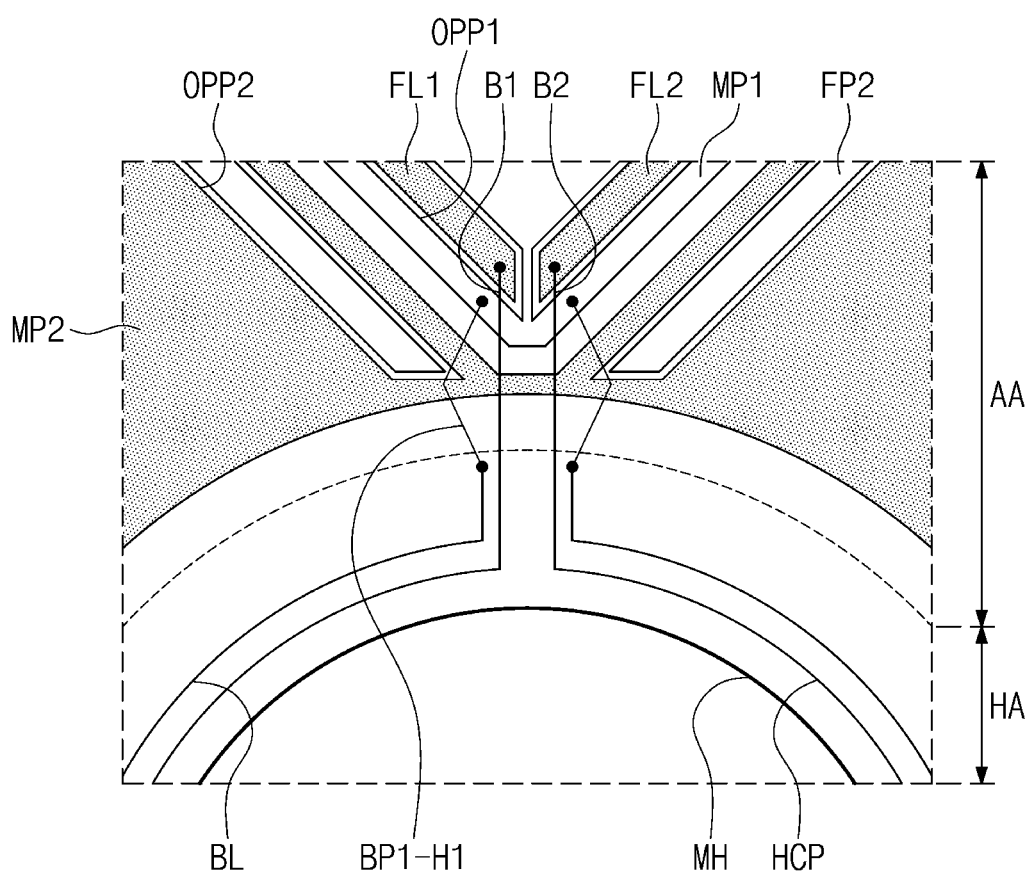
FIG. 5B is a plan view of a region of an electronic panel in accordance with an embodiment of the inventive concept.
Figure 5C:
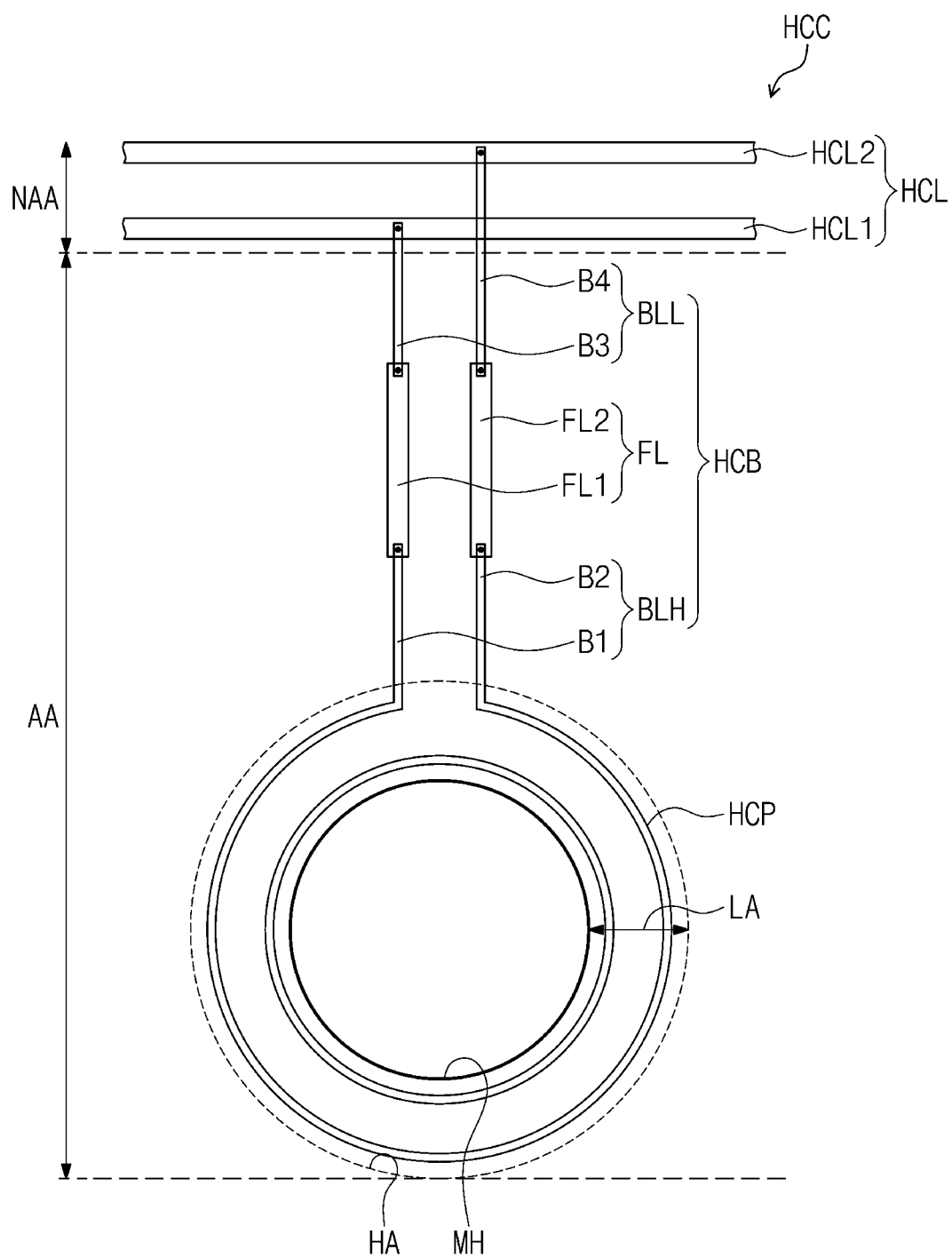
FIG. 5C is a schematic plan view of a crack sensor.

FIG. 5A is a plan view of a region of an electronic panel in accordance with an embodiment of the inventive concept. FIG. 5B is a plan view of a region of an electronic panel in accordance with an embodiment of the inventive concept. FIG. 5C is a schematic plan view of a crack sensor. FIG. 5B illustrates an enlarged view of a portion of components illustrated in FIG. 5A for ease of explanation. Hereinafter, an embodiment of the inventive concept will be described with reference to FIGS. 5A-5C. The same components as those described in FIGS. 1A-4 are denoted by the same reference numerals, and a duplicate description thereof may be omitted.

FIG. 5A illustrates a region of the sensing unit 220 which includes the hole area HA and may correspond to region XX'. FIG. 5B illustrates an enlarged view of the region of FIG. 5A. Referring to FIGS. 5A and 5B, the plurality of sensing patterns SP1 and SP2 are disposed along the edge of the hole region HA. The hole area HA, in accordance with the present embodiment, may be defined in a position that is encompassed (e.g., surrounded or partially surrounded) by four of the second sensing patterns SP2, and the four second sensing patterns SP2 may have a shape in which a portion thereof is relatively further removed compared to the first sensing patterns SP1.

Each of the first sensing patterns SP1 may include a first main portion MP1 and a plurality of first floating patterns FP1. The first main portion MP1 and the first floating patterns FP1 are spaced apart from each other on a plane.

The first main portion MP1 includes a conductive material. The first main portion MP1 may have an integral shape. The first main portion MP1 may have one or more opening portions OPP1 and OPP2.

The first floating patterns FP1 include a conductive material. The first floating patterns FP1 may be disposed at the same layer as the first main portion MP1. The first floating pattern FP1 may be disposed in the opening portions OPP1 to be spaced apart from the first main portion MP1 on a plane.

Each of the second sensing patterns SP2 may include a second main portion MP2 and a second floating pattern FP2. The second main portion MP2 and the second floating pattern FP2 are spaced apart from each other on a plane.

The second main portion MP2 and the second floating pattern FP2 include conductive materials. The second main portion MP2 and the second floating pattern FP2 are disposed at the same layer as each other. The second floating pattern FP2 may be spaced apart from the second main portion MP2 on the plane to be accommodated in the opening portion OPP2 that is defined in the second main portion MP2.

In the present embodiment, the second connection pattern BP2 extends in the first direction DR1 to connect the second sensing patterns SP2 adjacent thereto. The second connection pattern BP2 may be disposed at the same layer as the second sensing patterns SP2. The second connection pattern BP2 may have a shape in which the second connection pattern BP2 is integrated with the second sensing patterns SP2.

The first connection pattern BP1 extends in the second direction DR2 to connect the first sensing patterns SP1 adjacent thereto. The first connection pattern BP1 is disposed at a different layer from the first sensing patterns SP1. The first connection pattern BP1 may transmit an electrical signal that is independent from the second sensing patterns SP2 even when the first connection pattern BP1 overlaps the second sensing patterns SP2 on a plane. In the present embodiment, the first connection pattern BP1 may be connected to the first sensing patterns SP1 through a contact hole (e.g., a predetermined contact hole).

The first sensing patterns SP1 are spaced apart from each other in the second direction DR2 with the hole area HA therebetween, and are connected to each other through a hole connection line BL that is disposed in the hole area HA. For example, the hole connection line BL is connected to a first connection pattern BP1-H2 that is connected to an upper one of the first sensing patterns SP1 that are spaced apart from each other with the hole area HA therebetween, and to a first connection pattern BP1-H2 that is connected to a lower one of the first sensing patterns SP1. Accordingly, the first sensing patterns SP1 of the first electrode E1, that are spaced apart from each other by the hole area HA, may be electrically connected, and a stable external input sensing environment may thus be provided in the active area AA.

It should be understood that the depicted hole connection line BL is illustrative only and that any suitable hole connection line may be used. The hole connection line BL of the electronic panel 200, in accordance with an embodiment of the inventive concept, may also be omitted. In this case, the first connection patterns BP1-H1 and BP1-H2 may be directly connected to each other. Alternatively, the electronic panel 200 may further include a hole connection pattern that connects the second sensing patterns SP2 according to the position of the hole area HA, and is not limited to any one embodiment.

As described above, the crack sensor HCC includes the crack sensing pattern HCP, the crack sensing line HCL, and the connection line HCB. The crack sensing pattern HCP is disposed in the hole area HA. For example, the crack sensing pattern HCP may be disposed in the wiring area LA. The connection line HCB may include the hole connection portion BLH, a line connection portion BLL, and the floating portion FL.

The floating portion FL is disposed in the active area AA. The floating portion FL may overlap one or more of the first sensing patterns SP1 and the second sensing patterns SP2, which are disposed between the hole area HA and the crack sensing line HCL. In the present embodiment, the floating portion FL may include at least a portion of the first floating patterns FP1 of the first sensing pattern SP1. A portion, disposed in an area through which the connection line HCB passes, of the first floating patterns FP1 of the first sensing pattern SP1 may be connected to the hole connection portion BLH and the line connection portion BLL to serve as the floating portion FL.

The floating portion FL may include a first floating portion FL1 and a second floating portion FL2 that are spaced apart from each other. The hole connection portion BLH connects the floating portion FL to the crack sensing pattern HCP. The hole connection portion BLH may include a first connection portion B1 and a second connection portion B2. The first connection portion B1 connects a first end of the crack sensing pattern HCP to the first floating portion FL1. The second connection portion B2 connects a second end of the crack sensing pattern HCP to the second floating portion FL2.

In the present embodiment, the hole connection portion BLH may be disposed at a different layer from the floating portion FL. The hole connection portion BLH may be disposed between the second connection patterns BP2. The hole connection portion BLH may be spaced apart from the second connection patterns BP2 that are disposed at the same layer as the hole connection portion BLH, thereby reducing or preventing an electrical interference between the second connection patterns BP2 and the hole connection portion BLH.

The hole connection portion BLH may be disposed at a different layer from the first main portion MP1, the second main portion MP2, and the second connection pattern BP2. Accordingly, the hole connection portion BLH may transmit a signal that is independent from the first sensing electrodes TE1 or the second sensing electrodes TE2 even when the hole connection portion BLH overlaps the first main portion MP1, the second main portion MP2, and the second connection pattern BP2 on a plane.

The line connection portion BLL connects the floating portion FL to the crack sensing line HCL. The line connection portion BLL may include a third connection portion B3 and a fourth connection portion B4. The third connection portion B3 connects the first floating portion FL1 to the first line HCL1. The fourth connection portion B4 connects the second floating portion FL2 to the second line HCL2.

The third connection portion B3 and the fourth connection portion B4 may be connected to the first line HCL1 and the second line HCL2, respectively, through the third sensing lines TL3. The third connection portion B3 and the fourth connection portion B4 extend in a direction that intersects (or crosses) the third sensing lines TL3. The third connection portion B3 and the fourth connection portion B4 may be electrically insulated from the third sensing lines TL3. Accordingly, the crack sensor HCC may transmit or receive an electrical signal independently of the third sensing lines TL3 and the first sensing electrodes TE1.

An input signal, received from the first end of the first line HCL1, enters the first end of the crack sensing pattern HCP via the third connection portion B3, the first floating portion FL1, and the first connection portion B1, and is output from the second end of the crack sensing pattern HCP. The input signal is then output to the first end of the second line HCL2 via the second connection portion B2, the second floating portion FL2, and the fourth connection portion B4.

An input signal, received from the second end of the second line HCL2, enters the second end of the crack sensing pattern HCP via the fourth connection portion B4, the second floating portion FL2, and the second connection portion B2, and is output from the first end of the crack sensing pattern HCP. The input signal is then output to the second end of the first line HCL1 via the first connection portion B1, the first floating portion FL1, and the third connection portion B3.

Damage to the crack sensing pattern HCP or the crack sensing line HCL may be determined based on the signal output from the first end of the second line HCL2 and the signal output from the second end of the first line HCL1. Accordingly, whether a crack has occurred in the hole area HA or the peripheral area NAA may be sensed, thereby increasing the reliability of the electronic panel 200.

In accordance with an embodiment of the inventive concept, the first floating patterns FP1 provided in the first sensing pattern SP1 may be used as the floating portion FL, thereby omitting a separate line for a connection between the crack sensing line HCL and the crack sensing pattern HCP. Accordingly, the process may be simplified. Further, the floating portion FL may be spaced apart from the first main portion MP1, thereby transmitting a signal independent from the first sensing electrodes TE1. Thus, the crack sensor HCC integrated with the sensing unit 220 may be provided stably.

Figure 6A:
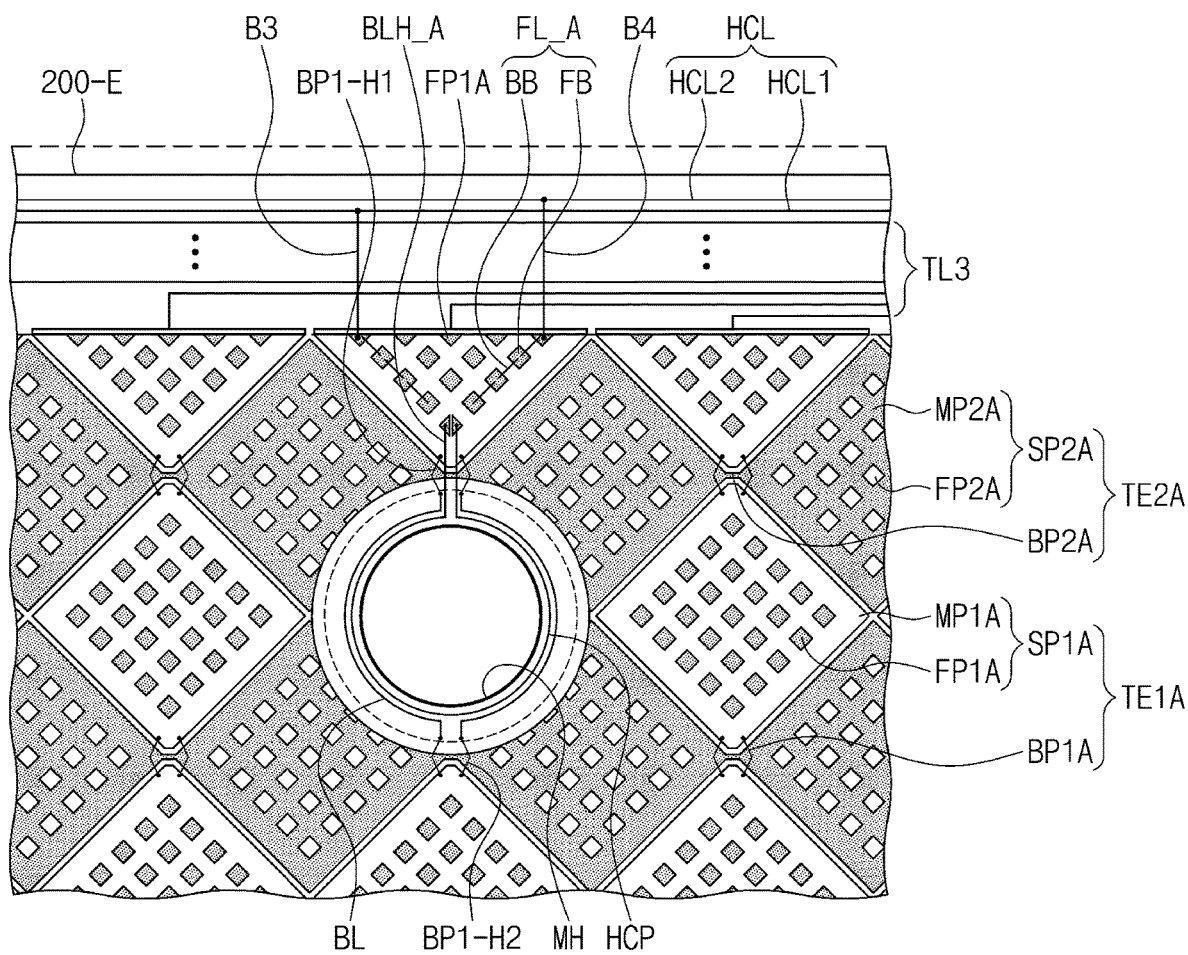
FIGS. 6A and 6B are plan views of regions of an electronic apparatus in accordance with an embodiment of the inventive concept.
Figure 6B:
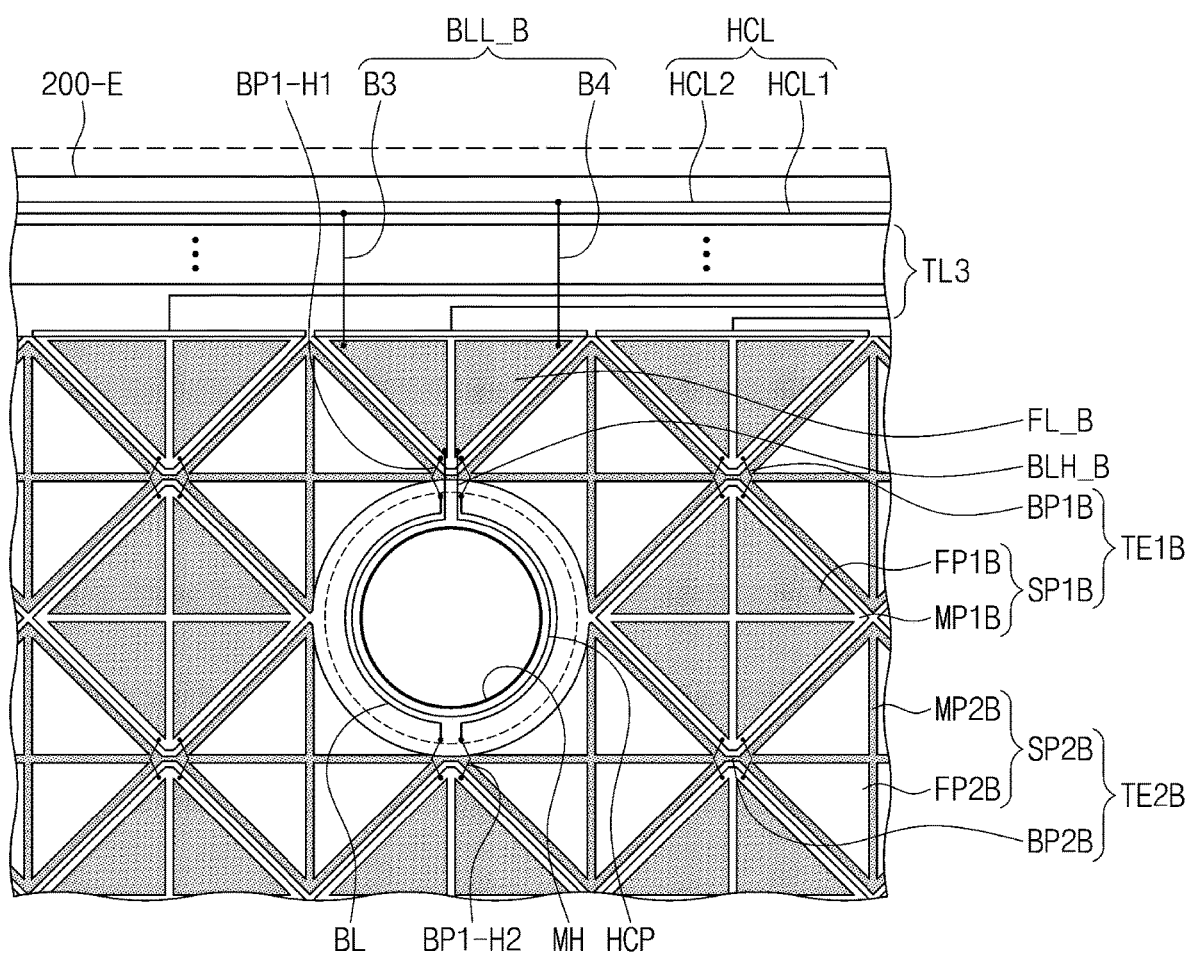

FIGS. 6A and 6B are plan views of regions of an electronic apparatus in accordance with an embodiment of the inventive concept. FIGS. 6A and 6B illustrate the regions that correspond to that of FIG. 5A. Hereinafter, an embodiment of the inventive concept will be described with reference to FIGS. 6A and 6B. The same components as those described in FIGS. 1A to 5C are denoted by the same reference numerals, and a duplicate description thereof may be omitted.

As illustrated in FIG. 6A, each of the first sensing electrodes TE1A in accordance with an embodiment of the inventive concept may include a plurality of first floating patterns FP1A, and each of the second sensing electrodes TE2A in accordance with an embodiment of the inventive concept may include a plurality of second floating patterns FP2A. For example, each of the first sensing electrodes TE1A includes a first sensing pattern SP1A and a first connection pattern BP1A. Because the first connection pattern BP1A has substantially the same shape as the first connection pattern BP1 that is illustrated in FIG. 5A, a duplicate description thereof may be omitted.

The first sensing pattern SP1A may include a first main portion MP1A and a plurality of first floating patterns FP1A. The first floating patterns FP1A may be respectively disposed in a plurality of opening portions that are defined in the first main portion MP1A. For ease of explanation, separating spaces between the first floating patterns FP1A and the first main portion MP1A are omitted from FIG. 6A.

Each of the second sensing electrodes TE2A includes a second sensing pattern SP2A and a second connection pattern BP2A. Because the second connection pattern BP2A has substantially the same shape as the second connection pattern BP2 that is illustrated in FIG. 5A, a duplicate description thereof may be omitted.

The second sensing pattern SP2A may include a second main portion MP2A and a plurality of second floating patterns FP2A. The second floating patterns FP2A may be respectively disposed in a plurality of opening portions that are defined in the second main portion MP2A. For ease of explanation, separating spaces between the second floating patterns FP2A and the second main portion MP2A are omitted from FIG. 6A.

In accordance with an embodiment of the inventive concept, the crack sensor HCC may include a floating portion FL_A that connects the crack sensing pattern HCP to the crack sensing line CSL. The floating portion FL_A may be defined by at least a portion of the first floating patterns FP1A of the first sensing pattern SP1A.

The floating portion FL_A includes a plurality of patterns FB and a plurality of contact patterns BB. The patterns FB are spaced apart from each other. The patterns FB are disposed at the same layer as the first main portion MP1A and may be spaced apart therefrom on a plane. The patterns FB may be a portion of the first floating patterns FP1A.

The contact patterns BB are disposed at a different layer from the first floating patterns FP1A. The contact patterns BB are each disposed between the first floating patterns FP1A to connect two adjacent first floating patterns FP1A. In accordance with an embodiment of the inventive concept, ones among the first floating patterns FP1A connected by the contact patterns BB define the floating portion FL_A that is electrically connected and may serve as a connection path that connects the crack sensing pattern HCP to the crack sensing line HCL.

Alternatively, as illustrated in FIG. 6B, first and second sensing electrodes TE1B and TE2B in accordance with an embodiment of the inventive concept may include first and second floating patterns FP1B and FP2B, respectively. In detail, each of the first sensing electrodes TE1B includes a first sensing pattern SP1B and a first connection pattern BP1B. Because the first connection pattern BP1B has substantially the same shape as the first connection pattern BP1 that is illustrated in FIG. 5A, a duplicate description thereof may be omitted.

The first sensing pattern SP1B may include a first main portion MP1B and a plurality of first floating patterns FP1B. The first floating patterns FP1B may be respectively disposed at a plurality of opening portions that are defined in the first main portion MP1B. For ease of explanation, separating spaces between the first floating patterns FP1B and the first main portion MP1B are omitted from FIG. 6B.

Each of the second sensing electrodes TE2B includes a second sensing pattern SP2B and a second connection pattern BP2B. Because the second connection pattern BP2B has substantially the same shape as the second connection pattern BP2 that is illustrated in FIG. 5A, a duplicate description thereof may be omitted.

The second sensing pattern SP2B may include a second main portion MP2B and a plurality of second floating patterns FP2B. The second floating patterns FP2B may be respectively disposed at a plurality of opening portions that are defined in the second main portion MP2B. For ease of explanation, separating spaces between the second floating patterns FP2B and the second main portion MP2B are omitted from FIG. 6B.

In accordance with an embodiment of the inventive concept, the crack sensor HCC may include a floating portion FL_B that connects the crack sensing pattern HCP to the crack sensing line CSL. The floating portion FL_B may be defined by at least a portion of the first floating patterns FP1B of the first sensing pattern SP1B. The floating portion FL_B is connected to a hole connection portion BLH_B and a line connection portion BLL_B.

In detail, the second floating patterns FP2B include two patterns that are spaced apart from each other. One of the second floating patterns FP2B is connected to the first end of the crack sensing pattern HCP. The other of the second floating patterns FP2B is connected to the second end of the crack sensing pattern HCP. Each of the second floating patterns FP2B may have an integral shape.

The floating portions FL_A and FL_B, in accordance with an embodiment of the inventive concept, may be provided in various suitable shapes as long as the floating portion FL_A may be spaced apart from the first sensing pattern SP1A and the second sensing pattern SP2A and the floating portion FL_B may be spaced apart from the first sensing pattern SP1B and the second sensing pattern SP2B, and the floating portions FL_A and FL_B are not limited to any one embodiment.

Figure 7A:
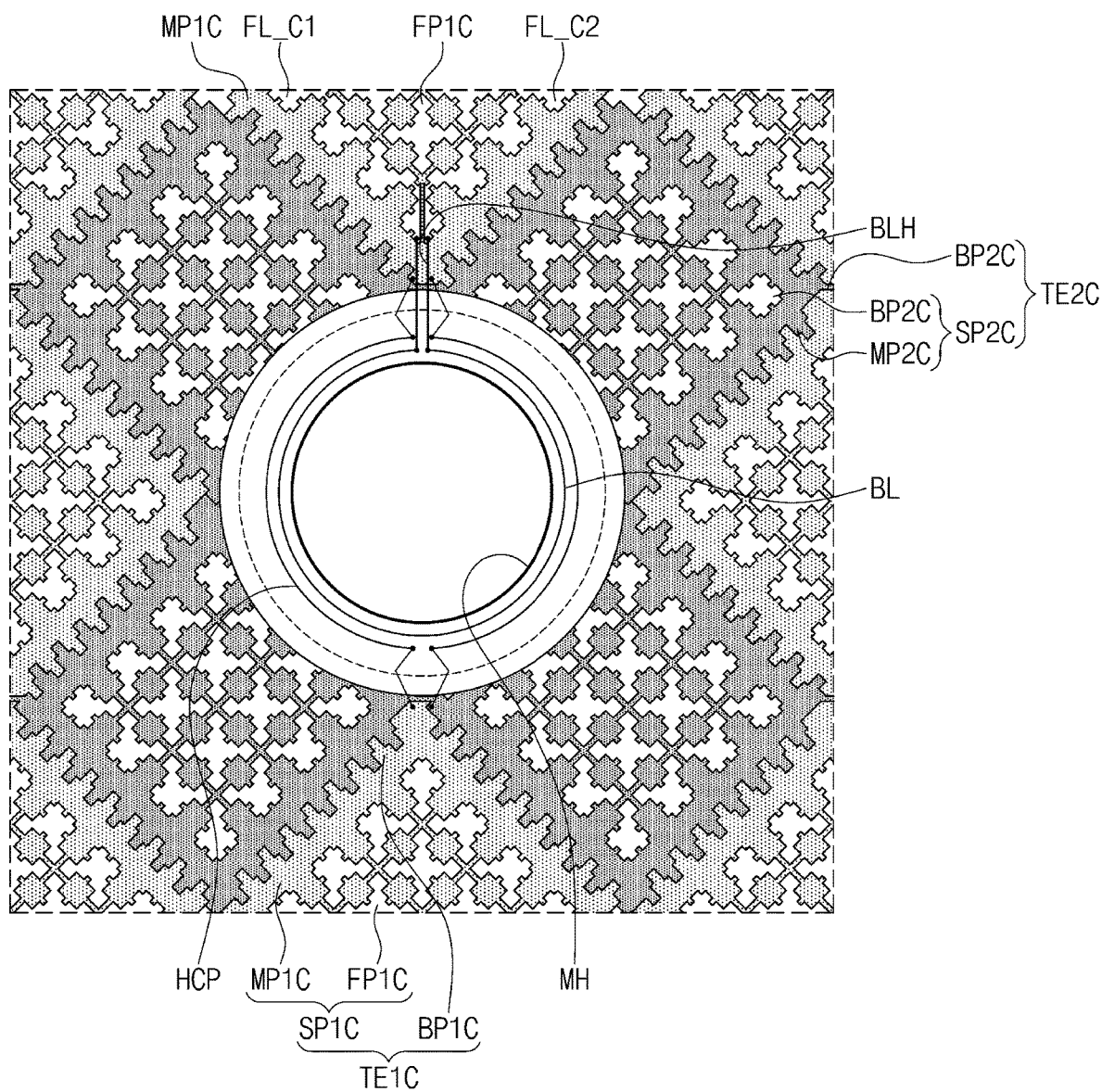
FIGS. 7A and 7B are plan views of regions of an electronic apparatus in accordance with an embodiment of the inventive concept.
Figure 7B:
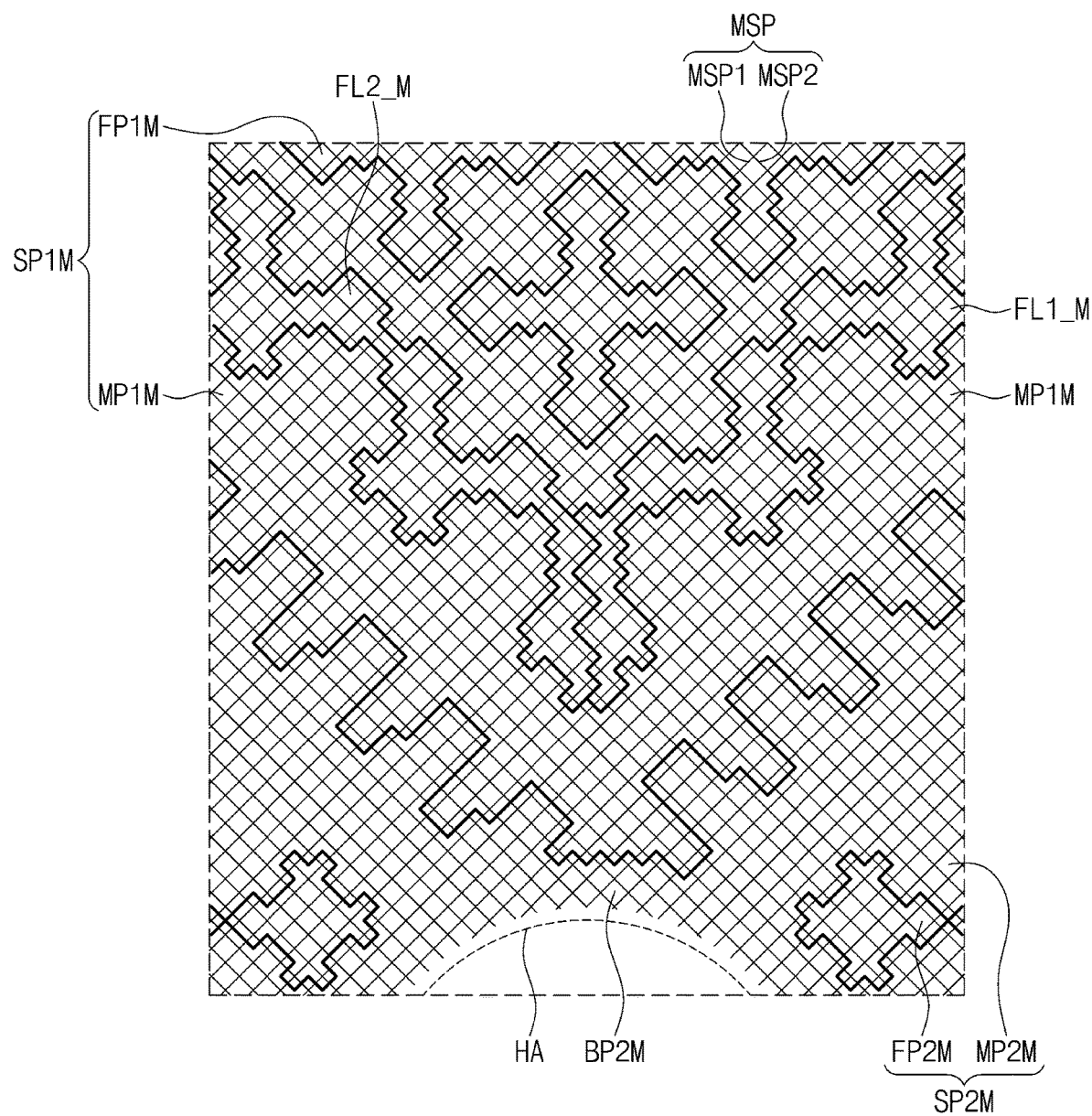
Figure 8A:
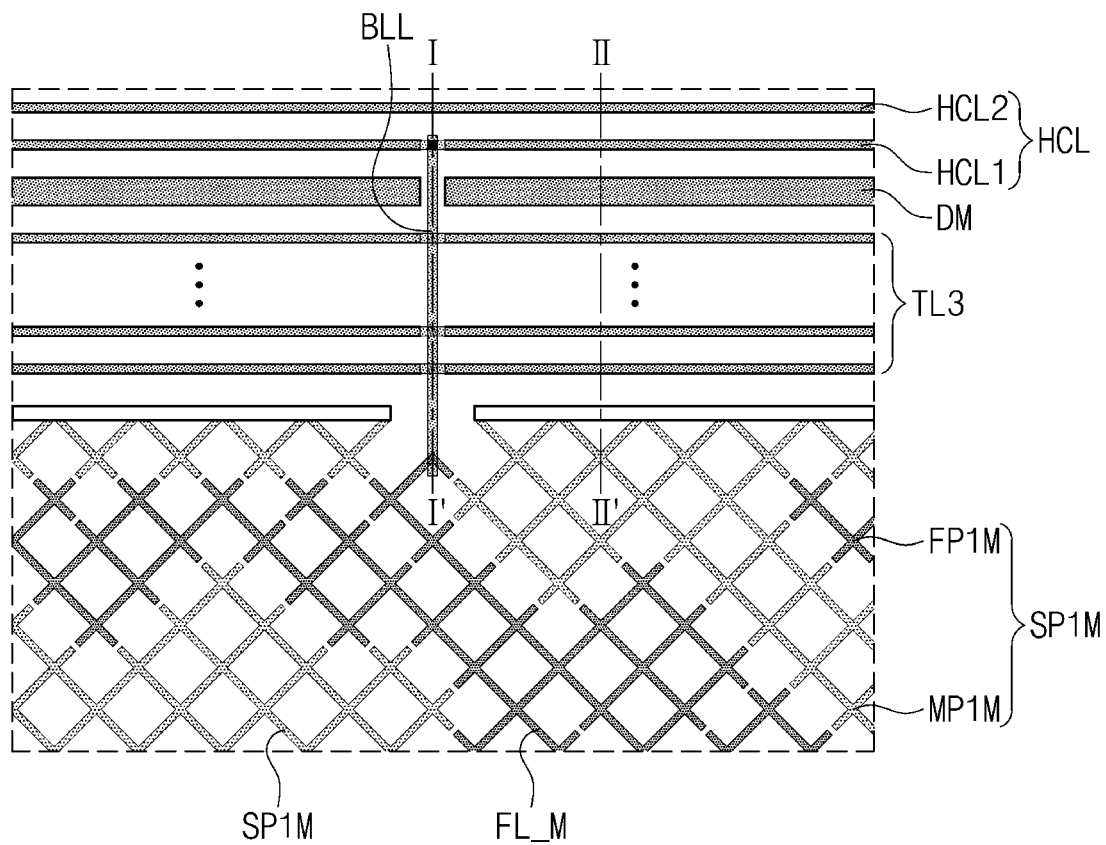
FIG. 8A is an enlarged plan view of the region illustrated in FIG. 7B.
Figure 8B:
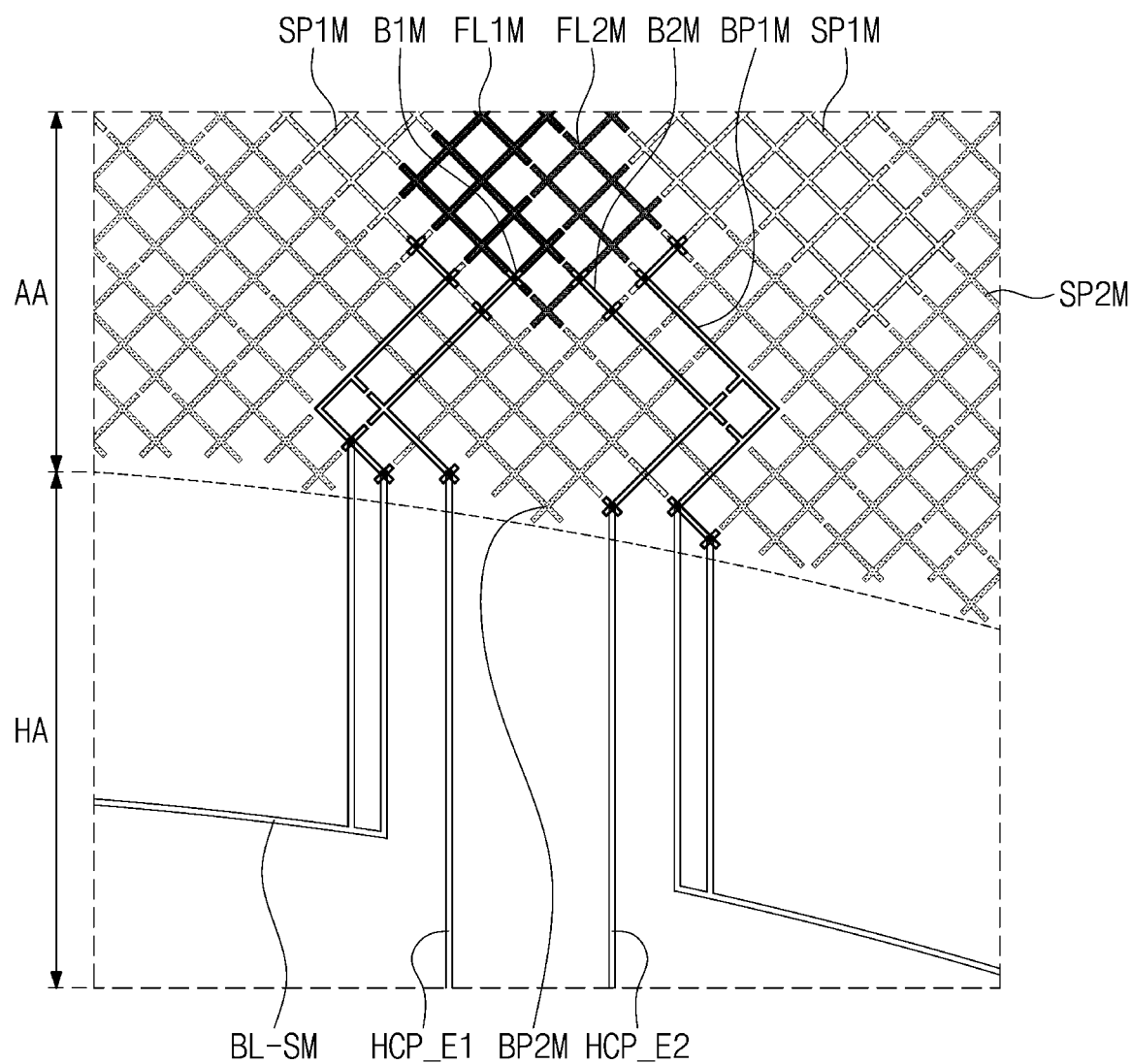
FIG. 8B is an enlarged plan view of the region illustrated in FIG. 7B.
Figure 9A:
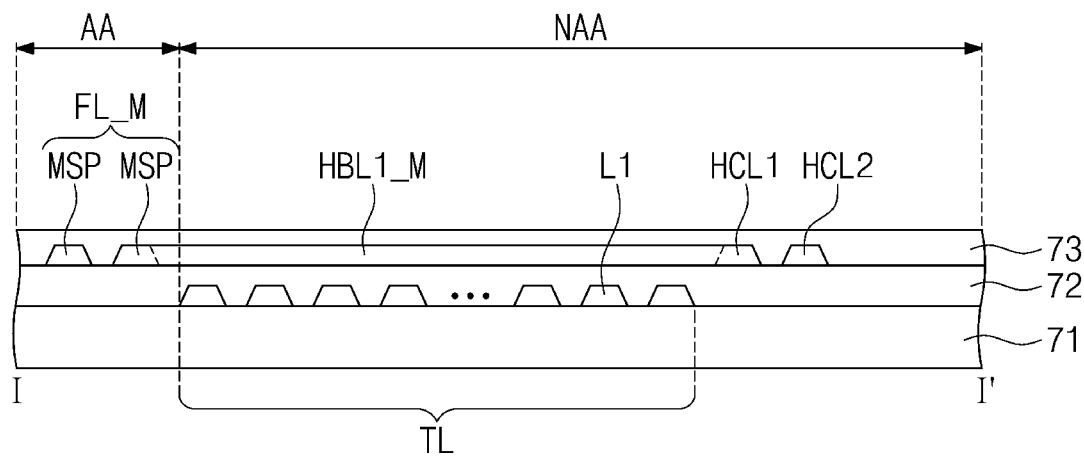
FIGS. 9A and 9B are cross-sectional views of an electronic panel in accordance with an embodiment of the inventive concept.
Figure 9B:
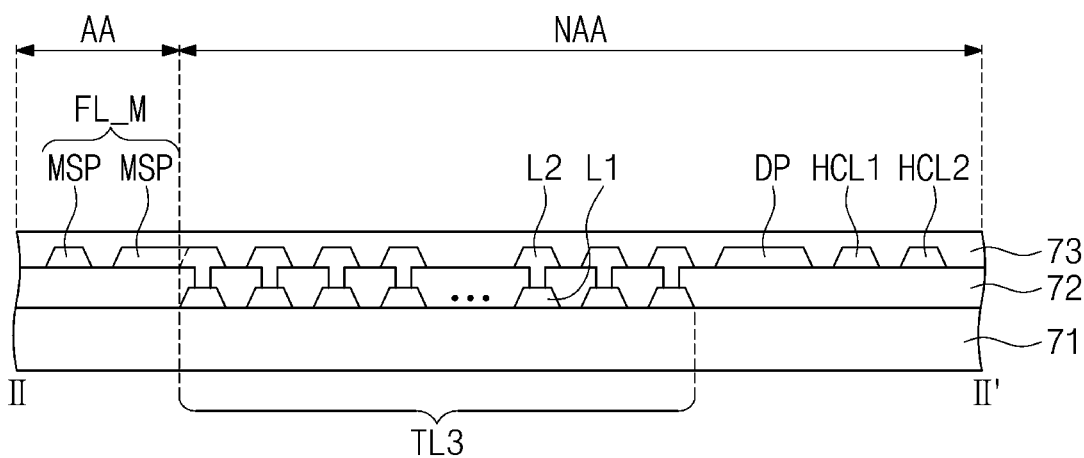

FIGS. 7A and 7B are plan views of regions of an electronic apparatus in an embodiment of the inventive concept. FIG. 8A is an enlarged plan view of the region illustrated in FIG. 7B. FIG. 8B is an enlarged plan view of the region illustrated in FIG. 7B. FIGS. 9A and 9B are cross-sectional views of an electronic panel in accordance with an embodiment of the inventive concept.

FIG. 7A illustrates a schematic plan view of the hole area HA and the active area AA adjacent thereto for ease of explanation. FIG. 7B only illustrates patterns disposed at the same layer with a portion of components omitted. FIG. 9A illustrates a cross-sectional view taken along the line I-I' of FIG. 8A, and FIG. 9B illustrates a cross-sectional view taken along the line II-II' of FIG. 8A. Hereinafter, an embodiment of the inventive concept will be described with reference to FIGS. 7A to 9B. The same components as those described in FIGS. 1A to 6B are denoted by the same reference numerals, and a duplicate description thereof may be omitted.

As illustrated in FIG. 7A, each of the first sensing patterns SP1C may include a plurality of first floating patterns FP1C, and each of the second sensing patterns SP2C may include a plurality of second floating patterns FP2C. For example, each of the first sensing patterns SP1C may include a first main portion MP1C and the plurality of first floating patterns FP1C that are spaced apart from the first main portion MP1C. Each of the second sensing patterns SP2C may include a second main portion MP2C and the plurality of second floating patterns FP2C that are spaced apart from the second main portion MP2C.

A portion of the floating patterns (FP1C and FP2C), through which a connection line HCB_C connected to the crack sensing pattern HCP passes, among the first sensing patterns SP1C and the second sensing patterns SP2C, may be used as one component of the connection line HCB_C. In the present embodiment, ones of the first floating patterns FP1C of the first sensing pattern SP1C, disposed at an upper side of the crack sensing pattern HCP, from among the first sensing patterns SP1C, may be connected to each other to define a floating portion FL_C1 that is connected to the first end of the crack sensing pattern HCP, and others thereof may be connected to each other to define a floating portion FL_C2 that is connected to the second end of the crack sensing pattern HCP. The others of the first floating patterns FP1C that do not function as the floating portions FL1_C and FL2_C may be separated from each other to serve as the first floating patterns FP1C of the first sensing patterns SP1C.

FIG. 7B illustrates an embodiment of a first sensing pattern SP1M and a second sensing pattern SP2M each having an irregular edge and mesh lines. FIG. 7B illustrates one first sensing pattern SP1M, one second sensing pattern SP2M, and one second connection pattern BP2M disposed at the same layer from among components of the electronic panel for ease of explanation.

As illustrated in FIG. 7B, the first sensing pattern SP1M and the second sensing pattern SP2M may include a plurality of mesh lines MSP. The mesh lines MSP may include a first mesh line MSP1 and a second mesh line MSP2 that intersect (e.g., cross) and are connected to each other. The mesh lines MSP define a plurality of opening portions. The opening portions may respectively overlap the light-emitting areas that are respectively defined by the light-emitting element EE described above.

The boundary between the first sensing pattern SP1M and the second sensing pattern SP2M may be defined by disconnecting a portion of the mesh lines MSP. In the present embodiment, the disconnected portion of the mesh lines MSP is illustrated by a thick line for ease of explanation. FIG. 7B illustrates the boundary between the first sensing pattern SP1M and the second sensing pattern SP2M that has a zigzag shape comprising a plurality of bumps.

The first sensing pattern SP1M includes a first main portion MP1M and a plurality of first floating patterns FP1M. The first floating patterns FP1M may be spaced apart from the first main portion MP1M on a plane. Thick lines, encompassing (e.g., surrounding or partially surrounding) edges of the first floating patterns FP1M, substantially define the boundaries between the first floating patterns FP1M and the first main portion MP1M. Each of the first floating patterns FP1M may include the plurality of mesh lines MSP and may be electrically insulated from the mesh lines MSP that constitute the first main portion MP1M adjacent to the first floating pattern FP1M.

The second sensing pattern SP2M may include a second main portion MP2M and a plurality of second floating patterns FP2M. The second floating patterns FP2M may be spaced apart from the second main portion MP2M on a plane. The second floating patterns FP2M are illustrated as having a different shape from the first floating patterns FP1M. It should be understood that the depicted second floating patterns FP2M are illustrative only and that any suitable second floating patterns may be used. The second floating patterns FP2M may also be provided in the same shape as the first floating patterns FP1M, but are not limited to any one embodiment.

The second connection pattern BP2M may be disposed at the same layer as the second sensing pattern SP2M. Accordingly, a first connection pattern (not illustrated) is disposed at a different layer from the first sensing pattern SP1M. The second connection pattern BP2M includes the plurality of mesh lines MSP. In the present embodiment, the second connection pattern BP2M is illustrated as having an integral shape in which the second connection pattern BP2M is integrated with the second sensing pattern SP2M, in particular, the second main portion MP2M.

In the present embodiment, floating portions FL1_M and FL2_M may be disposed at the same layer as the first sensing pattern SP1M. The floating portions FL1_M and FL2_M include a first floating portion FL1_M and a second floating portion FL2_M that are spaced apart from each other.

The first floating portion FL1_M and the second floating portion FL2_M are spaced apart from the first main portion MP1M on a plane (e.g., in a direction parallel with the front surface). In addition, the first floating portion FL1_M and the second floating portion FL2_M may be spaced apart from the first floating patterns FP1M on a plane (e.g., in a direction parallel to the front surface).

In the present embodiment, the first floating portion FL1_M and the second floating portion FL2_M may be defined by connecting a portion of the first floating patterns FP1M. Accordingly, the first floating portion FL1_M and the second floating portion FL2_M may be encompassed (e.g., surrounded or partially surrounded) by the first main portion MP1M and may be disposed inside the first sensing pattern SP1M.

FIG. 8A illustrates an enlarged view of the first sensing pattern SP1M in an area that is adjacent to the peripheral area NAA, and FIG. 8B illustrates the hole area HA and the active area AA adjacent to the hole area HA.

Referring to FIGS. 8A and 8B, each of the first main portion MP1M and the first floating pattern FP1M is illustrated as being formed as the mesh lines and spaced apart from each other. Separating spaces in which the mesh lines MSP are disconnected are present between the first main portion MP1M and the first floating pattern FP1M, and the separating spaces may correspond to the boundaries between the first main portion MP1M and the first floating pattern FP1M.

A floating portion FL_M is disposed within the first sensing pattern SP1M. The floating portion FL_M is spaced apart from the first floating pattern FP1M with the first main portion MP1M therebetween and may also be spaced apart from the first main portion MP1M. The disconnected mesh lines MSP are present between the floating portion FL_M and the first main portion MP1M.

The disconnected mesh lines MSP are present between the first sensing pattern SP1M and the second sensing pattern SP2M. In the present embodiment, patterns spaced apart from each other are illustrated by different shadings for ease of explanation.

A first floating portion FL1M and a second floating portion FL2M are disposed adjacent to each other, but are spaced apart from each other. The disconnected mesh lines MSP are present between the first floating portion and the second floating portion FL2M.

A first connection pattern BP1M is disposed at a different layer from the second connection pattern BP2M. The first connection pattern BP1M may be connected to the first sensing pattern SP1M through a contact hole (e.g., a predetermined contact hole). In the present embodiment, the first connection pattern BP1M is illustrated as a plurality of first connection patterns BP1M that are spaced apart from each other.

A first connection pattern BP1M may be connected through a hole connection line BL-SM to another first connection pattern BP1M that is spaced apart from the first connection pattern BP1M with the hole MH therebetween. In the present embodiment, the hole connection line BL-SM is illustratively depicted as including a plurality of contact portions with respect to one first connection pattern BP1M.

A pattern connection portion includes a first connection portion B1M and a second connection portion B2M. The first connection portion B1M connects a first end HCP_E1 of the crack sensing pattern HCP to the first floating portion FL1M, and the second connection portion B2M connects a second end HCP_E2 of the crack sensing pattern HCP to the second floating portion FL2M.

The first connection portion B1M and the second connection portion B2M may be disposed at a different layer from the first floating portion FL1M and the second floating portion FL2M. Accordingly, the first connection portion B1M and the second connection portion B2M may be connected to the first floating portion FL1M and the second floating portion FL2M, respectively, through a contact hole (e.g., a predetermined contact hole).

The first connection portion B1M and the second connection portion B2M may be disposed at the same layer as the first connection pattern BP1M. The first connection portion B1M and the second connection portion B2M are separated from the first connection pattern BP1M to be spaced apart therefrom on a plane (e.g., in a direction parallel to the front surface). Accordingly, the first connection portion B1M and the second connection portion B2M may transmit an electrical signal that is independent from the first sensing pattern SP1M.

The line connection portion BLL connects the floating portion FL_M to the crack sensing line HCL. In the present embodiment, the line connection portion BLL (see the third connection portion B3 of FIG. 5C) is illustrated as connecting the floating portion FL_M to the first line HCL1.

The electronic panel in accordance with an embodiment of the inventive concept may further include a dummy pattern DM. The dummy pattern DM is disposed between sensing lines TL3 and the crack sensing line HCL. The dummy pattern DM transmits an electrical signal different from that transmitted from the sensing lines TL3 and the crack sensing line HCL. The dummy pattern DM may be disposed between the sensing lines TL3 and the crack sensing line HCL, and transmit different signals, thereby reducing or preventing a parasitic capacitance that may be generated between the sensing lines TL3 and the crack sensing line HCL. Accordingly, the electrical reliability of the electronic panel may be increased. It should be understood that the depicted dummy pattern DM is illustrative only and may also be omitted from the electronic panel in accordance with an embodiment of the inventive concept.

Referring to FIGS. 9A and 9B, the plurality of mesh lines MSP constituting the floating portion FL_M are illustrated. The line connection portion BLL is disposed at the same layer as the floating portion FL_M and connected thereto to have an integral shape. It should be understood that the depicted line connection portion BLL and the floating portion FL_M are illustrative only and that any suitable line connection portion and floating portion may be used. The line connection portion BLL and the floating portion FL_M may also be independently formed and directly stacked with each other, but are not limited to any one embodiment.

Sensing lines TL may have a multi-layer structure that includes a first line portion L1 and a second line portion L2. Accordingly, an electrical resistance to the sensing lines TL may be reduced. The first line portion L1 is disposed between the first sensing insulating layer 71 and the second sensing insulating layer 72, and the second line portion L2 is disposed between the second sensing insulating layer 72 and the third sensing insulating layer 73. The first line portion L1 and the second line portion L2 may be connected to each other through the second sensing insulating layer 72.

In the present embodiment, the sensing lines TL and the first line HCL1 may overlap the line connection portion BLL on a plane (e.g., in a direction parallel to the front surface), but may be electrically insulated therefrom. In the present embodiment, the line connection portion BLL, the crack sensing pattern HCP, and the crack sensing lines HCL1 and HCL2 are disposed at the same layer. In the present embodiment, the line connection portion BLL is illustrated as having an integral shape in which the line connection portion BLL is connected to the crack sensing pattern HCP and the second line HCL2. It should be understood that the depicted line connection portion BLL is illustrative only and any suitable line connection portion may be used. The line connection portion BLL may also be directly stacked on the second line HCL2, but is not limited to any one embodiment.

The second line portion L2 of the sensing lines TL3 may be removed from a section in which the sensing lines TL3 overlap the line connection portion BLL. Accordingly, the first line portion L1 may overlap the line connection portion BLL on a plane (e.g., in a direction perpendicular to the front surface), but the second line portion L2 may be spaced apart from the line connection portion BLL on a plane (e.g., in a direction parallel to the front surface). As a result, an electrical connection between the sensing lines TL3 and the line connection portion BLL may be prevented.

Figure 10A:
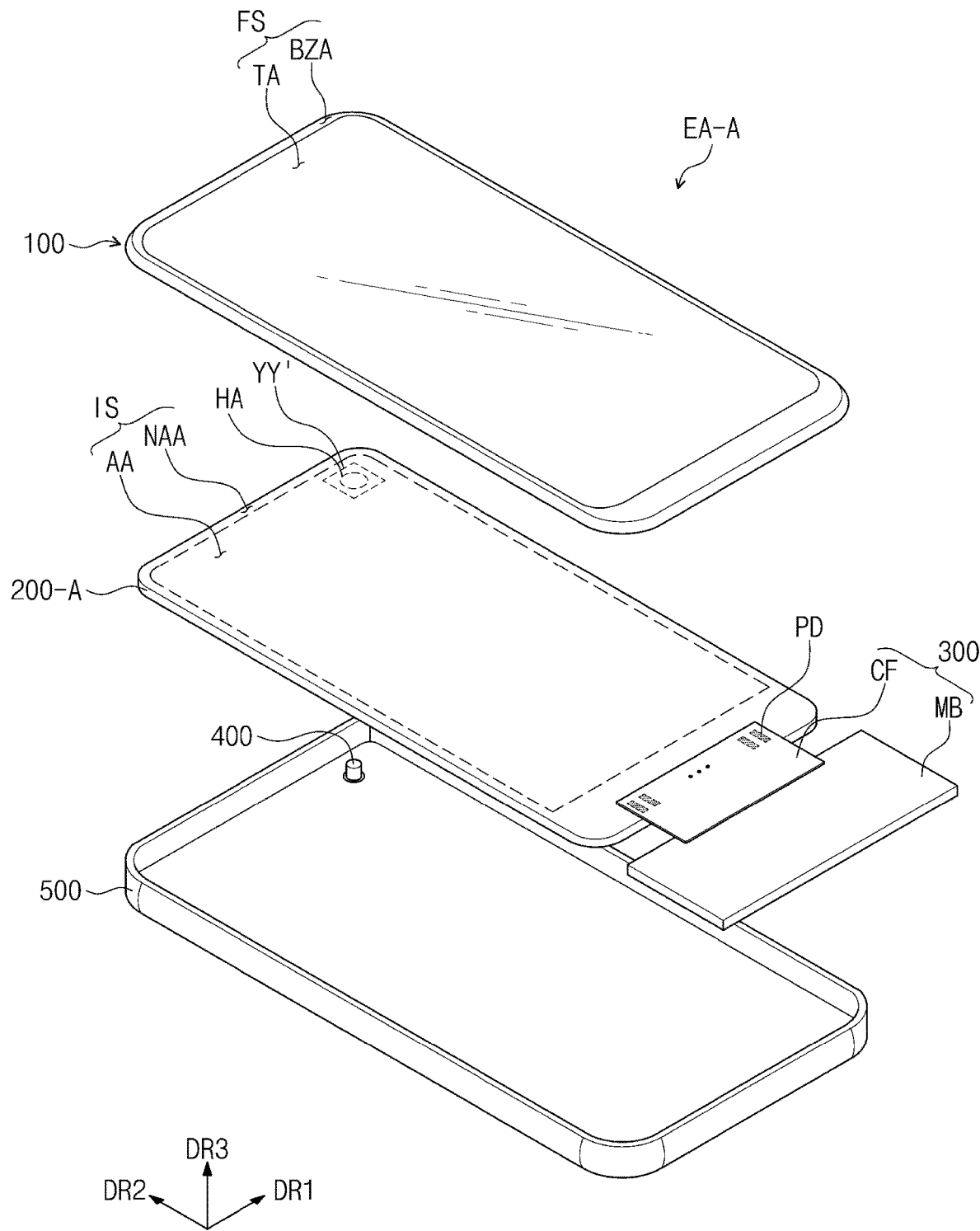
FIG. 10A is an exploded perspective view of an electronic apparatus in accordance with an embodiment of the inventive concept.
Figure 10B:
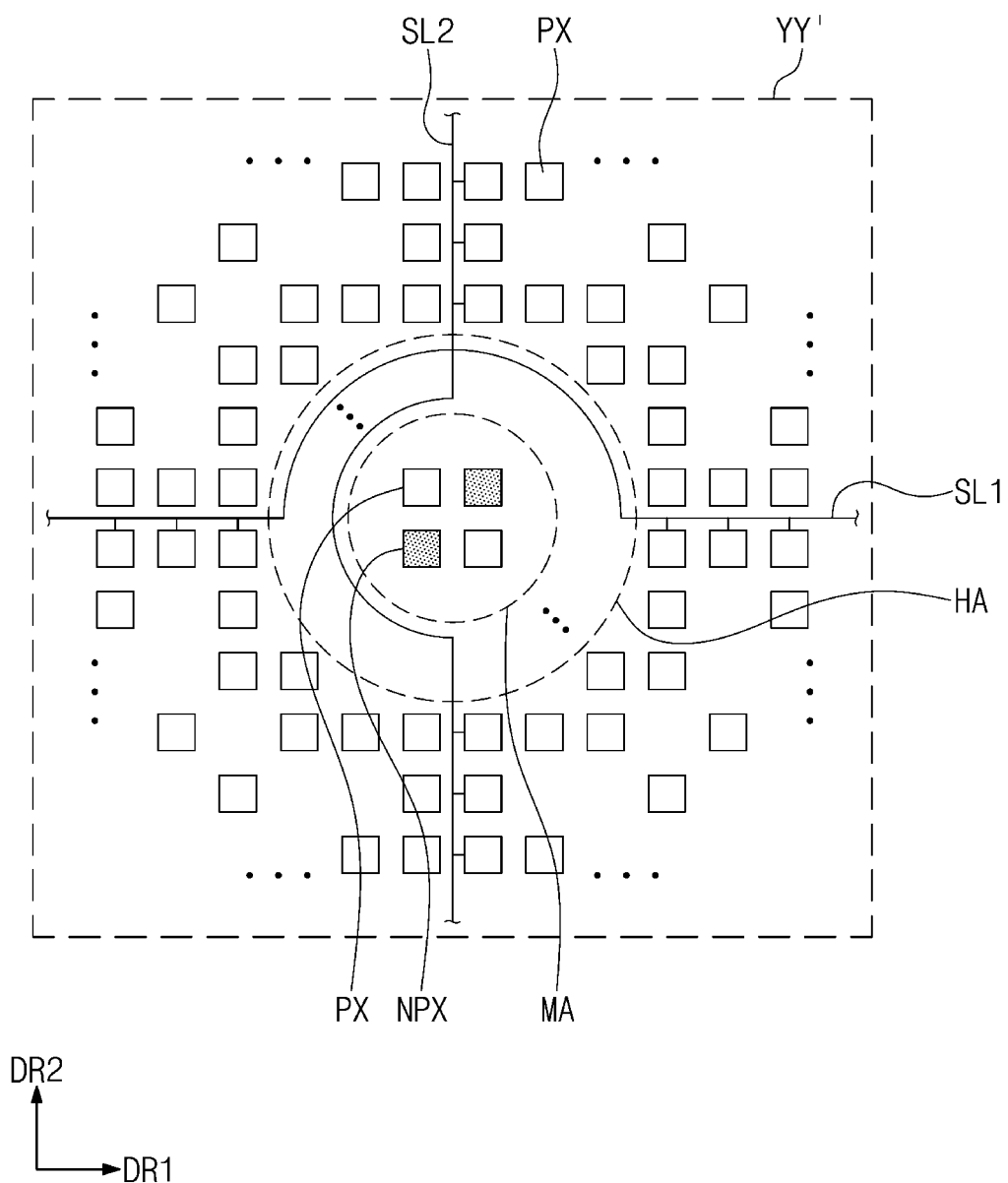
FIG. 10B is a schematic plan view of a region of the electronic apparatus illustrated in FIG. 10A.
Figure 11A:
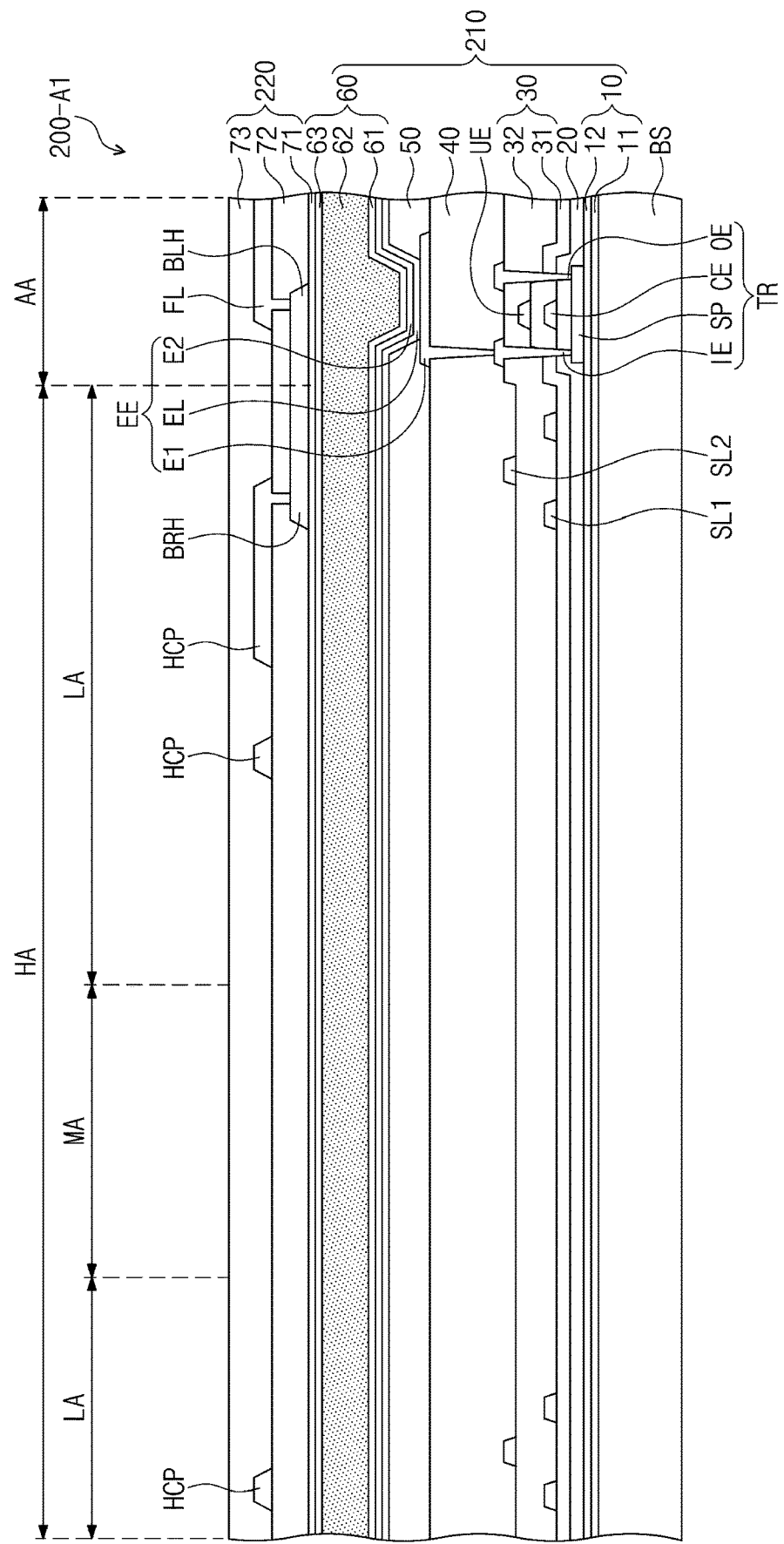
FIGS. 11A and 11B are cross-sectional views of electronic panels in accordance with an embodiment of the inventive concept.
Figure 11B:
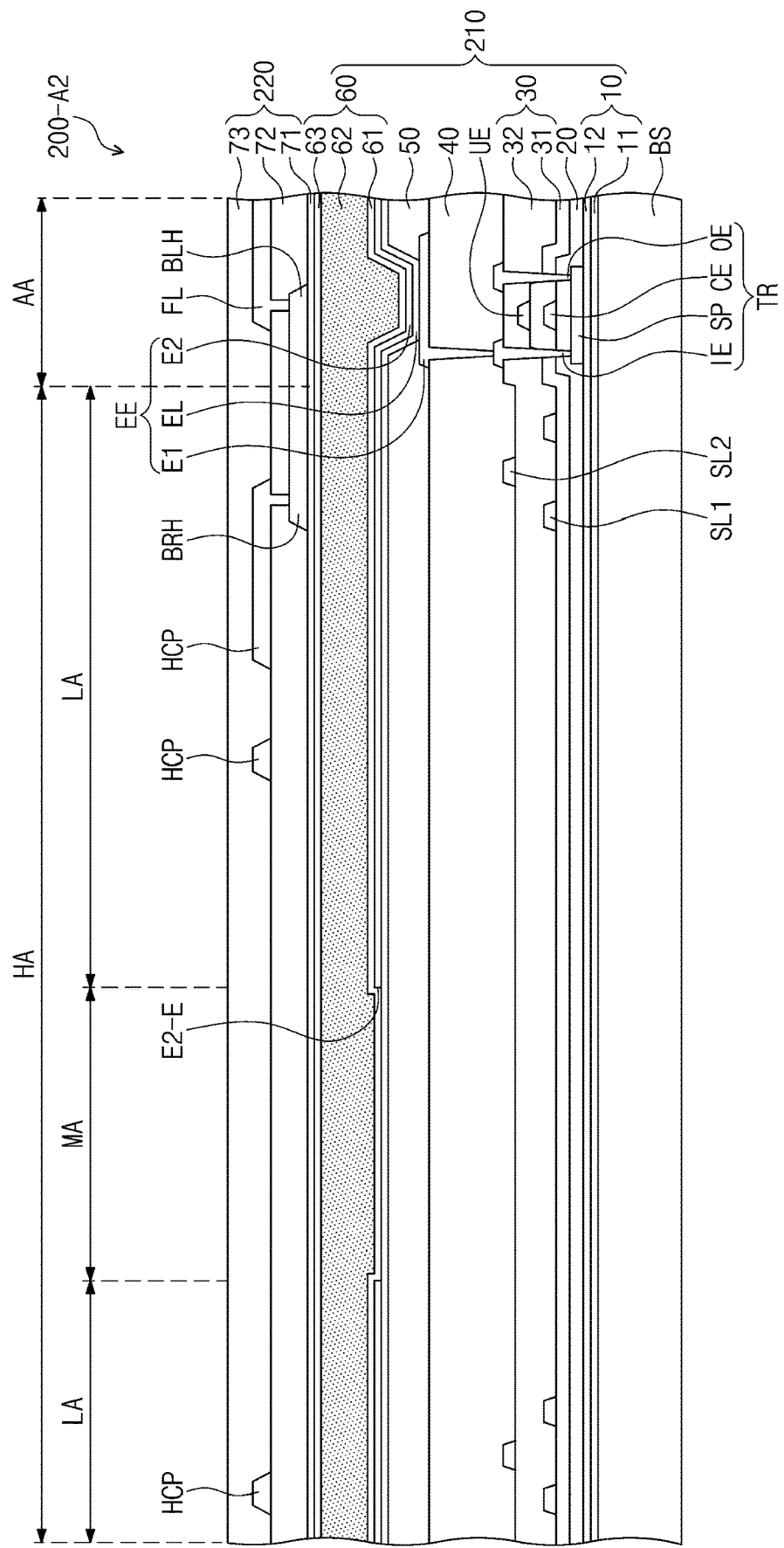

FIG. 10A is an exploded perspective view of an electronic apparatus in accordance with an embodiment of the inventive concept. FIG. 10B is a schematic plan view of a region of FIG. 10A. FIGS. 11A and 11B are cross-sectional views of electronic panels in accordance with an embodiment of the inventive concept. FIG. 10B illustrates region YY' illustrated in FIG. 10A, and FIGS. 11A and 11B illustrate regions corresponding to that of FIG. 4. Hereinafter, an embodiment of the inventive concept will be described with reference to FIGS. 10A-11B. The same components as those described in FIGS. 1A-9B are denoted by the same reference numerals, and a duplicate description thereof may be omitted.

The hole MH (see FIG. 1B) may be omitted from an electronic apparatus EA-A in accordance with an embodiment of the inventive concept. A hole area HA may include a module area MA and a wiring area LA.

The wiring area LA may be defined along an edge of the module area MA. The wiring area LA may encompass (e.g., surround or partially surround) the edge of the module area MA. The hole area HA may correspond to an area that includes the module area MA and the wiring area LA.

The module area MA may be substantially a space through which an external signal input to an electronic module 400 or a signal output from the electronic module 400 is transmitted.

The module area MA may have a relatively high transmittance compared to an area, having pixels PX disposed therein, of an active area AA. The electronic module 400 may sense an external subject or easily provide an output optical signal to the outside through the module area MA.

In the present embodiment, the module area MA may have a shape that corresponds to that of the hole MH described above. For example, the module area MA may have, on a plane, a circular shape, an elliptical shape, a polygonal shape, or a polygonal shape that includes a curved side on at least one side thereof, and the module area MA is not limited to any one embodiment.

The module area MA, in accordance with the present embodiment, may have at least one non-light-emitting pixel NPX disposed therein. FIG. 10B illustrates two non-light-emitting pixels NPX and two pixels PX for ease of explanation. The non-light-emitting pixel NPX may have a relatively high light transmittance compared to the pixel PX. The non-light-emitting pixel NPX may be formed by removing at least a portion of components of the pixel PX.

For example, the non-light-emitting pixel NPX may be formed by removing a thin-film transistor TR of the pixel PX. Alternatively, the non-light-emitting pixel NPX may be formed by removing a light-emitting layer EL of the components of the pixel PX, a portion of components of the thin-film transistor TR, or only a first electrode E1. In an alternative manner, the non-light-emitting pixel NPX may be formed by removing all of the components of the pixel PX. In this case, the non-light-emitting pixel NPX may be substantially defined by a portion in which a plurality of insulating layers are stacked.

The non-light-emitting pixel NPX, in accordance with an embodiment of the inventive concept, may include various embodiments as long as the non-light-emitting pixel NPX may have a higher light transmittance than the pixel PX. Further, as long as the module area MA may have a relatively higher light transmittance than the periphery thereof, the module area MA may be formed as a plurality of pixels PX and one non-light-emitting pixel NPX or as only a plurality of non-light-emitting pixels NPX, but is not limited to any one embodiment.

For example, as illustrated in FIG. 11A, the module area MA may be formed by removing the thin-film transistor TR and the first electrode E1 of the pixel PX. The insulating layers of the module area MA may extend continuously.

A base substrate BS, first to fifth insulating layers 10, 20, 30, 40, and 50, an organic layer EL, an encapsulation layer 60, and sensing insulating layers 71, 72, and 73 may overlap the module area MA without being disconnected within the hole area HA. The base substrate BS, the first to fifth insulating layers 10, 20, 30, 40, and 50, the organic layer EL, the encapsulation layer 60, and the sensing insulating layers 71, 72, and 73 may be entirely formed within the active area AA via the module area MA.

In the present embodiment, a second electrode E2 may overlap the module area MA. When the second electrode E2 is formed as a transmissive or transflective electrode, the module area MA having a relatively higher light transmittance than the area, in which the pixel PX is disposed, may be formed even when the second electrode E2 overlaps the module area MA.

A crack sensing pattern HCP may be disposed at the wiring area LA and may encompass (e.g., surround or partially surround) the edge of the module area MA on a plane (e.g., in a direction parallel to the front surface). The crack sensing pattern HCP may be disposed along the edge of the module area MA, thereby preventing a reduction in light transmittance of the module area MA. As described above, a floating portion FL connected to the crack sensing pattern HCP is disposed between the second sensing insulating layer 72 and the third sensing insulating layer 73. In accordance with an embodiment of the inventive concept, a portion of floating patterns disposed at the active area AA may be used as the floating portion FL to have no need for a line configured to transmit an electrical signal to the crack sensing pattern HCP, thereby simplifying the process and reducing the process cost.

For example, as illustrated in FIG. 11B, the second electrode E2 may also be removed from the module area MA. The second electrode E2 may have an end portion E2-E that defines an opening portion overlapping the module area MA.

Accordingly, even when the second electrode E2 is formed as a non-transmissive electrode, the module area MA having an improved light transmittance may be provided. Further, even when the second electrode E2 is formed as a transflective electrode, the module area MA having a relatively higher light transmittance than an electronic panel 200-A1 illustrated in FIG. 11A may be provided.

In accordance with an embodiment of the inventive concept, a signal may be easily input or output between the outside and an electronic module that does not require a high light transmittance, for example, an electronic module using infrared light, through the module area MA formed by removing opaque components. Even when the electronic module 400 overlaps the electronic panel 200-A1 or an electronic panel 200-A2, a signal may be stably input or output between the electronic module 400 and the outside. Further, the electronic panel 200-A1 or 200-A2 may cover an upper portion of the electronic module 400, thereby stably protecting the electronic module 400 from an external impact or contaminants.

In accordance with an embodiment of the inventive concept, a crack sensor may be formed within an electronic panel, thereby easily determining whether cracking occurs. Further, an electrical interference between the crack sensor and sensing electrodes may be prevented or reduced, and the process may be simplified.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An electronic panel comprising:
   a base substrate having a first area, a second area adjacent to the first area, and a third area adjacent to the second area, the second area disposed between the first area and the third area;
   a plurality of sensing electrodes in the second area;
   a plurality of sensing lines in the third area and electrically connected to the plurality of sensing electrodes;
   a crack sensing pattern in the first area and spaced apart from the plurality of sensing electrodes;
   a crack sensing line in the third area and spaced apart from the plurality of sensing lines; and
   a connection line comprising a floating portion connecting the crack sensing pattern to the crack sensing line via the second area,
   wherein the floating portion is at the same layer as the crack sensing pattern, is spaced apart from the plurality of sensing electrodes, and is electrically insulated from the plurality of sensing electrodes.

2. The electronic panel of claim 1, wherein the connection line further comprises a pattern connection portion connecting the floating portion to the crack sensing pattern, and wherein the pattern connection portion is at a different layer than the floating portion.

3. The electronic panel of claim 1, wherein the connection line further comprises a line connection portion connecting the floating portion to the crack sensing line, and
wherein the line connection portion is at a different layer than the floating portion.

4. The electronic panel of claim 1, further comprising a plurality of pixels at the second area and configured to provide a plurality of light-emitting areas,
wherein each of the plurality of sensing electrodes comprises a plurality of mesh lines defining a plurality of mesh opening portions, and the plurality of mesh opening portions overlap the plurality of light-emitting areas.

5. The electronic panel of claim 1, further comprising a hole in the first area and configured to pass through the base substrate,
wherein the crack sensing pattern has an open curve shape extending along an edge of the hole.

6. The electronic panel of claim 1, wherein each of the plurality of sensing electrodes comprises:
a first sensing electrode comprising a first sensing pattern and a first connection pattern connected to the first sensing pattern; and
a second sensing electrode comprising a second sensing pattern spaced apart from the first sensing pattern, and a second connection pattern at a different layer from the first connection pattern and connected to the second sensing pattern, wherein
the floating portion is at the same layer as the first connection pattern or the second connection pattern.

7. The electronic panel of claim 6, wherein at least one of the first sensing pattern or the second sensing pattern comprises:
a main portion comprising a plurality of opening portions; and
a plurality of floating patterns at the plurality of opening portions and spaced apart from the main portion, and
wherein the floating portion is on at least one of the plurality of opening portions.

8. The electronic panel of claim 7, wherein the floating portion is at the same layer as the main portion.

9. The electronic panel of claim 6, wherein the floating portion comprises:
a first floating portion connected to a first end of the crack sensing pattern; and
a second floating portion spaced apart from the first floating portion and connected to a second end of the crack sensing pattern.

10. The electronic panel of claim 9, wherein at least one of the first floating portion or the second floating portion has an integral shape.

11. The electronic panel of claim 9, wherein at least one of the first floating portion or the second floating portion comprises a plurality of patterns spaced apart from each other and a plurality of contact patterns connecting the plurality of patterns, and
wherein the plurality of contact patterns are at a different layer from the plurality of patterns.

12. An electronic panel comprising:
a base substrate having a first area, a second area adjacent to the first area, and a third area adjacent to the second area;
a plurality of sensing electrodes in the second area;
a plurality of sensing lines in the third area and electrically connected to the plurality of sensing electrodes;
a crack sensing pattern in the first area and spaced apart from the plurality of sensing electrodes;
a crack sensing line in the third area and spaced apart from the plurality of sensing lines;
a connection line comprising a floating portion connecting the crack sensing pattern to the crack sensing line via the second area; and
a connection line at the first area and connecting two first sensing patterns of first sensing electrodes, the two first sensing patterns being spaced apart from each other with the first area therebetween,
wherein the floating portion is at the same layer as the crack sensing pattern, and is spaced apart from, and electrically insulated from, the plurality of sensing electrodes,
wherein each of the plurality of sensing electrodes comprises:
a first sensing electrode comprising a first sensing pattern and a first connection pattern connected to the first sensing pattern; and
a second sensing electrode comprising a second sensing pattern spaced apart from the first sensing pattern, and a second connection pattern at a different layer from the first connection pattern and connected to the second sensing pattern,
wherein the floating portion is at the same layer as the first connection pattern or the second connection pattern, and
wherein the connection line is at the same layer as the crack sensing pattern, and the connection line and the crack sensing pattern are spaced apart from each other.

13. The electronic panel of claim 12, wherein a first end of the connection line is connected to the first connection pattern connected to one of the two first sensing patterns, and a second end of the connection line is connected to the first connection pattern connected to the other of the two first sensing patterns.

14. An electronic apparatus comprising:
an electronic panel configured to sense an external input and to display an image; and
an electronic module for operating the electronic apparatus and overlapping the electronic panel,
wherein the electronic panel comprises:
a base substrate having a hole area overlapping the electronic module, an active area adjacent to the hole area, and a peripheral area adjacent to the active area;
a first sensing electrode comprising a first sensing pattern having at least one opening portion, and a first connection pattern connected to the first sensing pattern;
a second sensing electrode comprising a second sensing pattern spaced apart from the first sensing pattern, and a second connection pattern at a different layer from the first connection pattern and connected to the second sensing pattern; and
a crack sensor comprising a crack sensing pattern at the hole area and spaced apart from the first sensing electrode and the second sensing electrode, a crack sensing line at the peripheral area, and a floating portion connecting the crack sensing pattern to the crack sensing line via the active area, and
wherein the floating portion is at the at least one opening portion.

15. The electronic apparatus of claim 14, wherein the crack sensor further comprises a pattern connection portion connecting the floating portion to the crack sensing pattern, and wherein the pattern connection portion is at a different layer than the floating portion.

16. The electronic apparatus of claim 14, wherein the crack sensor further comprises a line connection portion connecting the floating portion to the crack sensing line, and
wherein the line connection portion is at a different layer than the floating portion.

17. The electronic apparatus of claim 14, wherein the floating portion is at the same layer as the first sensing pattern.

18. The electronic apparatus of claim 14, wherein the floating portion comprises a plurality of patterns spaced apart from each other and a plurality of contact patterns connecting the plurality of patterns, and
wherein the plurality of contact patterns are at a different layer than the plurality of patterns.

19. The electronic apparatus of claim 14, wherein the floating portion has an integral shape.

20. The electronic apparatus of claim 14, wherein each of the first sensing electrode and the second sensing electrode comprises a plurality of mesh lines, and the floating portion comprises the plurality of mesh lines.

\* \* \* \* \*